(12) United States Patent
Tang et al.

(10) Patent No.: US 12,009,811 B2
(45) Date of Patent: *Jun. 11, 2024

(54) HIGH-SPEED SAMPLER

(71) Applicant: QUALCOMM Incorporated, San Diego, CA (US)

(72) Inventors: Chiu Keung Tang, San Diego, CA (US); Zhiqin Chen, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/327,832

(22) Filed: Jun. 1, 2023

(65) Prior Publication Data

US 2023/0396247 A1 Dec. 7, 2023

Related U.S. Application Data

(63) Continuation of application No. 17/805,211, filed on Jun. 2, 2022, now Pat. No. 11,711,077.

(51) Int. Cl.
*G11C 7/06* (2006.01)
*G11C 27/02* (2006.01)
(Continued)

(52) U.S. Cl.
CPC ........... *H03K 17/6872* (2013.01); *G11C 7/06* (2013.01); *G11C 27/02* (2013.01); *H03K 17/6874* (2013.01); *H03K 19/20* (2013.01)

(58) Field of Classification Search
CPC ........ H03K 3/027; H03K 3/037; H03K 3/353; H03K 3/356; H03K 3/35609;
(Continued)

(56) References Cited

U.S. PATENT DOCUMENTS

| 5,508,648 | A | 4/1996 | Banik |
| 6,396,308 | B1 | 5/2002 | Bosnyak et al. |

(Continued)

FOREIGN PATENT DOCUMENTS

| KR | 101063872 B1 | 9/2011 |
| KR | 20200024555 A | 3/2020 |

OTHER PUBLICATIONS

International Search Report and Written Opinion—PCT/US2023/022677—ISA/EPO—Sep. 11, 2023.

(Continued)

*Primary Examiner* — Long Nguyen
(74) *Attorney, Agent, or Firm* — Loza & Loza, LLP

(57) ABSTRACT

A regeneration circuit includes a first inverting circuit, a second inverting circuit, a first transistor coupled to an input of the second inverting circuit, and a second transistor coupled to an input of the first inverting circuit. The regeneration circuit also includes a third transistor including a gate coupled to a gate of the first transistor, a first switch configured to couple the third transistor to the input of the second inverting circuit based on a voltage of the first inverting circuit, a fourth transistor including a gate coupled to a gate of the second transistor, and a second switch configured to couple the fourth transistor to the input of the first inverting circuit based on a voltage of the second inverting circuit.

19 Claims, 16 Drawing Sheets

(51) Int. Cl.
*H03K 17/687* (2006.01)
*H03K 19/20* (2006.01)

(58) Field of Classification Search
CPC ....... H03K 3/356113; H03K 3/356165; H03K 5/24; H03K 5/2472; H03K 5/2481; H03K 5/249; H03K 17/687; H03K 17/6872; H03K 17/6874; H03K 19/20; G11C 7/06; G11C 7/065; G11C 7/067; G11C 27/02
See application file for complete search history.

(56) References Cited

U.S. PATENT DOCUMENTS

| | | | |
|---|---|---|---|
| 6,480,037 B1 | 11/2002 | Song et al. | |
| 7,196,550 B1 | 3/2007 | Reinschmidt | |
| 7,227,798 B2 | 6/2007 | Gupta et al. | |
| 7,388,772 B1 | 6/2008 | Xu et al. | |
| 8,624,632 B2 | 1/2014 | Bulzacchelli | |
| 11,037,607 B2 | 6/2021 | Chong et al. | |
| 11,095,273 B1 * | 8/2021 | Rasmus | G11C 7/065 |
| 11,374,560 B1 * | 6/2022 | Rasmus | G11C 7/062 |
| 11,711,077 B1 * | 7/2023 | Tang | G11C 27/02 |
| | | | 327/581 |
| 2006/0176085 A1 | 8/2006 | Wakamatsu et al. | |
| 2008/0012619 A1 | 1/2008 | Morimura et al. | |
| 2009/0108881 A1 | 4/2009 | Wilson | |
| 2013/0147520 A1 | 6/2013 | Payne | |
| 2016/0254806 A1 | 9/2016 | Chong | |
| 2017/0063361 A1 | 3/2017 | Jenkins et al. | |
| 2017/0179848 A1 | 6/2017 | Shimizu | |
| 2019/0007000 A1 | 1/2019 | Jeong et al. | |
| 2020/0204184 A1 | 6/2020 | Rattan | |

OTHER PUBLICATIONS

International Search Report and Written Opinion—PCT/US2022/026719—ISA/EPO—Aug. 4, 2022.

* cited by examiner

HIGH-SPEED SAMPLER

CROSS-REFERENCE TO RELATED APPLICATION

This Continuation Application claims priority to and the benefit of U.S. Pat. No. 11,711,077, filed in the United States Patent and Trademark Office on Jun. 2, 2022, the entire content of which is incorporated herein as if fully set forth below in its entirety and for all applicable purposes.

BACKGROUND

Field

Aspects of the present disclosure relate generally to samplers, and more particularly, to high-speed samplers.

Background

High-speed samplers may be used in high-speed serializer/deserializer (SerDes) applications. For example, a sampler may be used in high-speed SerDes to sample a high-speed signal received by a receiver. The sampler may include a regeneration circuit that provides the sampler with regenerative feedback for quickly capturing data bits from the received signal. It is desirable to increase the speed of the sampler to sample a signal at higher data rates and/or increase the sensitivity of the sampler to capture data bits from a small signal.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

In certain aspects, a regeneration circuit is provided. The regeneration circuit includes a first inverting circuit, a second inverting circuit, a first transistor coupled to an input of the second inverting circuit, and a second transistor coupled to an input of the first inverting circuit. The regeneration circuit also includes a third transistor including a gate coupled to a gate of the first transistor, a first switch configured to couple the third transistor to the input of the second inverting circuit based on a voltage of the first inverting circuit, a fourth transistor including a gate coupled to a gate of the second transistor, and a second switch configured to couple the fourth transistor to the input of the first inverting circuit based on a voltage of the second inverting circuit.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
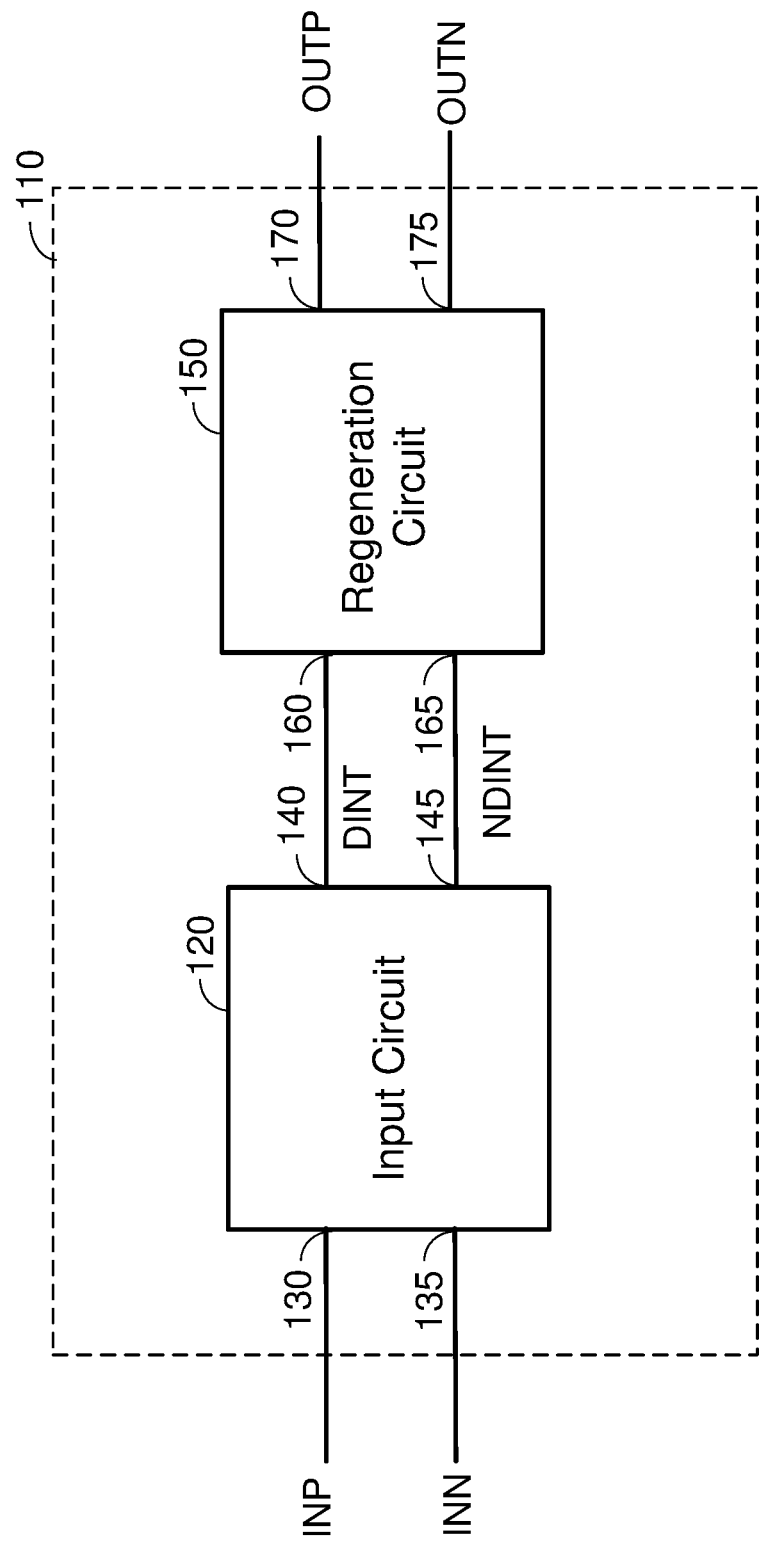
FIG. 1 shows an example of a sampler including an input circuit and a regeneration circuit according to certain aspects of the present disclosure.

FIG. 1 shows an example of a sampler 110 according to certain aspects of the present disclosure. The sampler 110 may be used, for example, in high-speed SerDes to sample an incoming data signal. The sampler 110 may also be referred to as a sense amplifier or another term. The sampler 110 includes an input circuit 120 and a regeneration circuit 150. The input circuit 120 may also be referred to as an input stage or another term, and the regeneration circuit 150 may also be referred to as a regeneration stage, a latch (e.g., cross-coupled latch), or another term.

As shown in FIG. 1, the input circuit 120 has a first input 130, a second input 135, a first output 140, and a second output 145. The regeneration circuit 150 has a first input 160, a second input 165, a first output 170, and a second output 175. The first input 160 of the regeneration circuit 150 is coupled to the first output 140 of the input circuit 120, and the second input 165 of the regeneration circuit 150 is coupled to the second output 145 of the input circuit 120.

In this example, the input circuit 120 is configured to receive a differential input signal (e.g., differential data signal) that includes a first input voltage INP and a second input voltage INN. The first input voltage INP is received at the first input 130 and the second input voltage INN is received at the second input 135. The differential input signal may have a small differential voltage (i.e., a small difference between the first input voltage INP and the second input voltage INN) in which the polarity of the differential voltage represents a bit value. For the example of SerDes, the sampler 110 may be integrated on a first chip that is coupled to a second chip via a link, and the sampler may receive the differential input signal from a transmitter on the second chip via the link.

The input circuit 120 generates a first voltage DINT at the first output 140 and a second voltage NDINT at the second output 145 based on the first input voltage INP and the second input voltage INN. As discussed further below, the input circuit 120 is configured to set the first voltage DINT and the second voltage NDINT to a reset voltage (e.g., supply voltage) during a reset phase, and change (e.g., discharge) the first voltage DINT and the second voltage NDINT at different rates based on the first input voltage INP and the second input voltage INN during a regeneration phase.

The regeneration circuit 150 is configured to receive the first voltage DINT at the first input 160 and receive the second voltage NDINT at the second input 165. As discussed further below, during the regeneration phase, the regeneration circuit 150 is configured to convert the first voltage DINT and the second voltage NDINT into a differential output voltage using regenerative feedback. The differential output signal includes a first output voltage OUTP at the first output 170 and a second output voltage OUTN at the second output 175, in which the polarity of the differential output voltage represents a captured (i.e., resolved) bit value. It is desirable for the regeneration circuit 150 to quickly convert the first voltage DINT and the second voltage NDINT into a large differential output voltage (i.e., a large difference between the first output voltage OUTP and the second output voltage OUTN) during the regeneration phase to quickly resolve a bit value for high-speed applications.

The first output 170 and the second output 175 of the regeneration circuit 150 may be coupled to a latch (not shown) configured to latch a captured bit value from the sampler 110. The latch may include a set-reset (SR) latch or another type of latch.

Figure 2A:
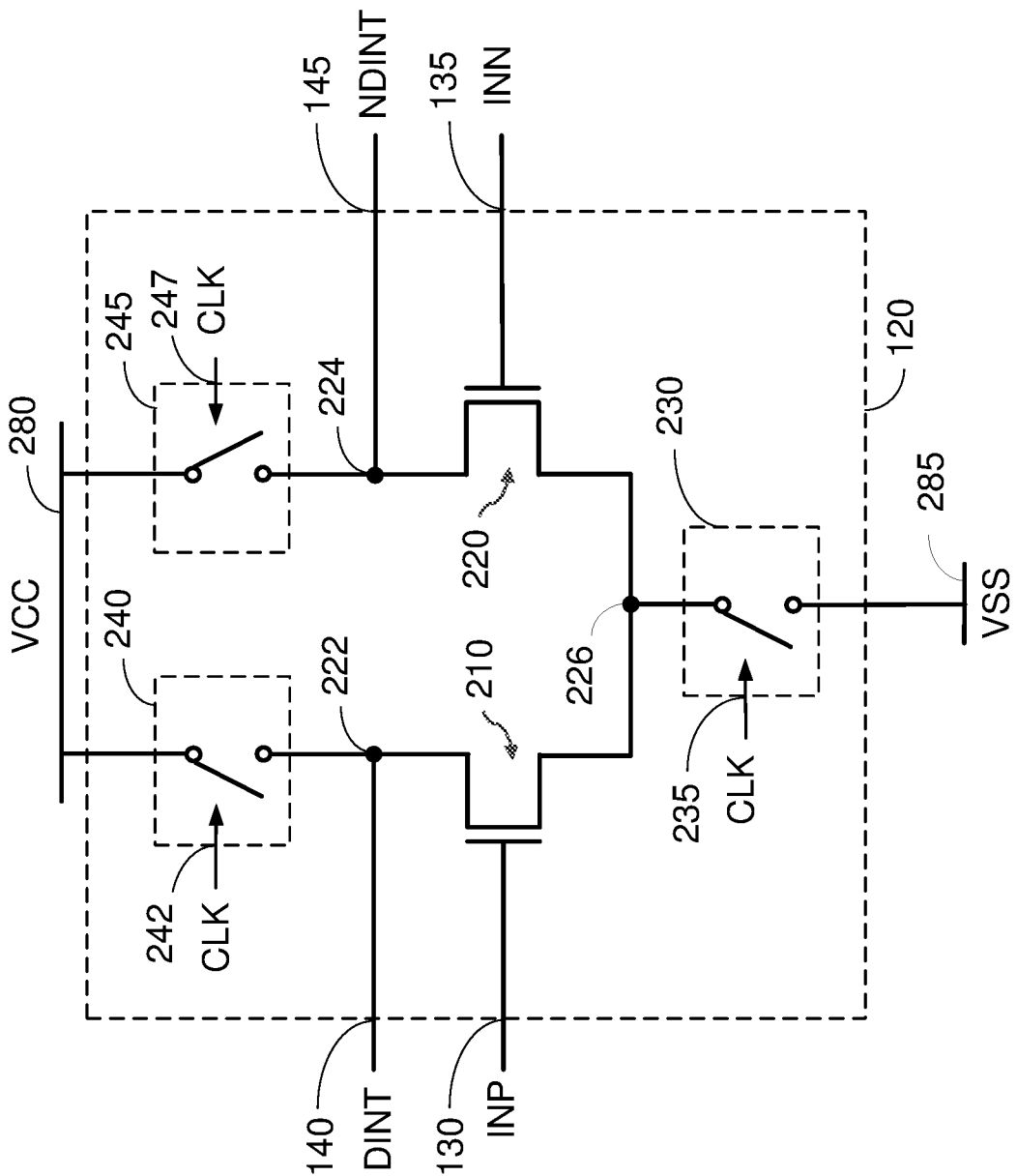
FIG. 2A shows an exemplary implementation of the input circuit according to certain aspects of the present disclosure.

FIG. 2A shows an exemplary implementation of the input circuit 120 according to certain aspects. The input circuit 120 includes a first input transistor 210, a second input transistor 220, a first switch 230, a second switch 240, and a third switch 245. The second switch 240 is coupled between an upper rail 280 and the first input transistor 210, and the third switch 245 is coupled between the upper rail 280 and the second input transistor 220. The first input transistor 210 is coupled between the second switch 240 and node 226, and the second input transistor 220 is coupled between the third switch 245 and node 226. The first switch 230 is coupled between node 226 and a lower rail 285. In one example, the upper rail 280 may provide a supply voltage VCC and the lower rail 285 may be coupled to ground. In general, the upper rail 280 is at a higher potential than the lower rail 285. The upper rail 280 may also be referred to as a supply rail or another term.

In the example shown in FIG. 2A, the first input transistor 210 is implemented with a first n-type field effect transistor (NFET) and the second input transistor 220 is implemented with a second NFET. It is to be appreciated that the first input transistor 210 and the second input transistor 220 are not limited to NFETs and may be implemented with other types of transistors. In this example, the second switch 240 is coupled between the upper rail 280 and the drain of the first input transistor 210, and the first switch 230 is coupled between the source of the first input transistor 210 and the lower rail 285. The gate of the first input transistor 210 is coupled to the first input 130 of the input circuit 120 and therefore receives the first input voltage INP. Also, in this example, the third switch 245 is coupled between the upper rail 280 and the drain of the second input transistor 220, and the first switch 230 is coupled between the source of the second input transistor 220 and the lower rail 285. The gate of the second input transistor 220 is coupled to the second input 135 of the input circuit 120 and therefore receives the second input voltage INN.

The first switch 230 has a control input 235 driven by a timing signal, the second switch 240 has a control input 242 driven by the timing signal, and the third switch 245 has a control input 247 driven by the timing signal. In one example, the first switch 230 is configured to turn on when the timing signal is high and turn off when the timing signal is low, and each one of the second switch 240 and the third switch 245 is configured to turn on when the timing signal is low and turn off when the timing signal is high. In the example shown in FIG. 2A, the timing signal is a clock signal CLK. As used herein, a "clock signal" is a periodic signal that oscillates between a high logic state and a low logic state. In certain aspects, a high logic state (i.e., logic state of one) may correspond to a voltage approximately equal to the supply voltage VCC and a low logic state (i.e., logic state of zero) may correspond to a voltage approximately equal to ground.

As used herein, a "control input" of a switch is an input that controls the on/off state of the switch based on a signal (e.g., a voltage signal) at the control input. For an example where a switch is implemented with a transistor, the control input is located at the gate of the transistor. In one example, the first switch 230 may be implemented with an NFET, and each of the second switch 240 and the third switch 245 may be implemented with a respective PFET. However, it is to be appreciated that the present disclosure is not limited to this example.

In this example, the first output 140 is coupled to a first node 222 between the second switch 240 and the first input transistor 210, and the second output 145 is coupled to a second node 224 between the third switch 245 and the second input transistor 220. As discussed above, the input circuit 120 outputs the first voltage DINT at the first output 140 and outputs the second voltage NDINT at the second output 145. In the example in FIG. 1, the first output 140 is coupled to the drain of the first input transistor 210, and the second output 145 is coupled to the drain of the second input transistor 220.

Figure 2B:
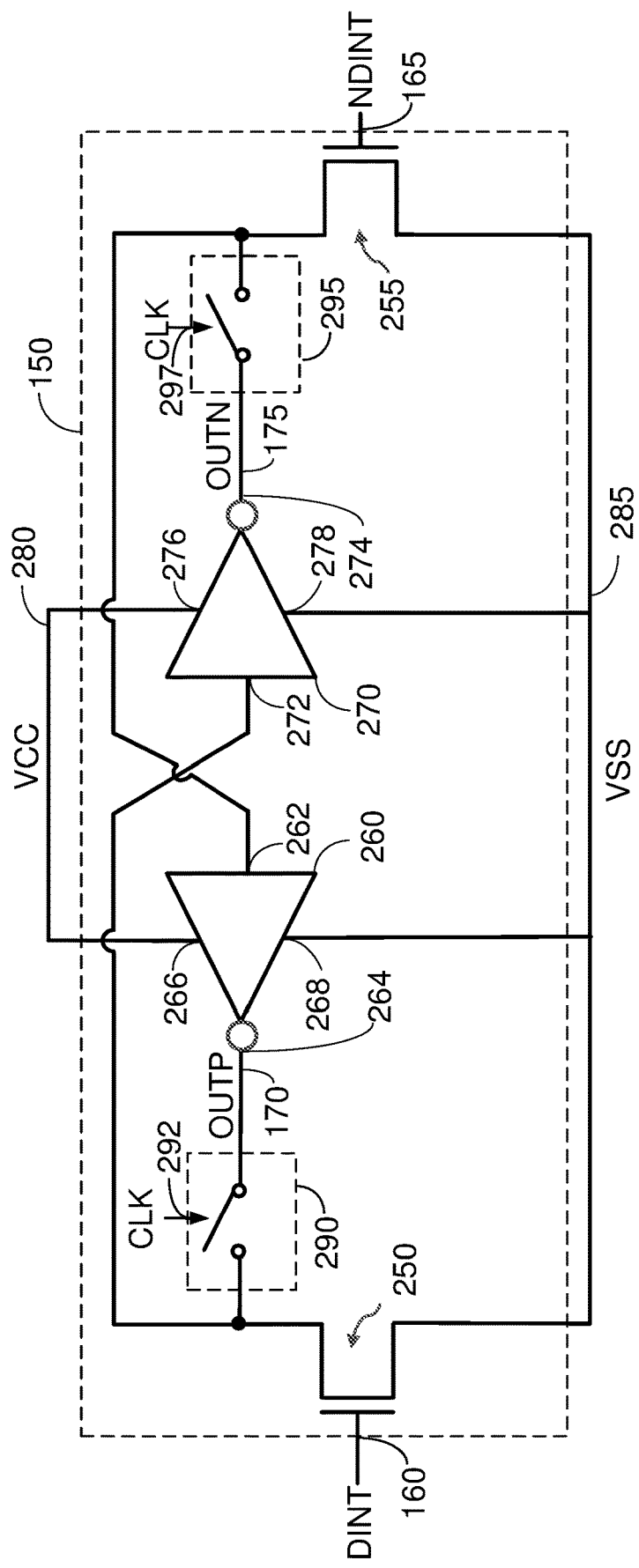
FIG. 2B shows an exemplary implementation of the regeneration circuit according to certain aspects of the present disclosure.

FIG. 2B shows an exemplary implementation of the regeneration circuit 150 according to certain aspects. In this example, the regeneration circuit 150 includes a first input transistor 250, a second input transistor 255, a first switch 290, a second switch 295, a first inverting circuit 260, and a second inverting circuit 270. As discussed further below, the first inverting circuit 260 and the second inverting circuit 270 are cross coupled during the regeneration phase to provide regenerative feedback. As used herein, an "inverting circuit" is a circuit configured to invert a logic state (i.e., logic level or logic value) at an input of the inverting circuit and output the inverted logic state at an output of the inverting circuit. The logic state may be represented by a voltage in which a low voltage (e.g., approximately ground) may represent a logic state of zero and a high voltage (e.g., approximately a supply voltage) may represent a logic state of one. In certain aspects, an inverting circuit has a threshold voltage in which the output of the inverting circuit transitions from low to high when the voltage at the input of the inverting circuit falls below the threshold voltage, and the output of the inverting circuit transitions from high to low when the voltage at the input of the inverting circuit rises above the threshold voltage. An inverting circuit may also be referred to as an inverter, an inverting circuit, or another term.

The first inverting circuit 260 has an input 262, an output 264, a first supply terminal 266, and a second supply terminal 268. The second inverting circuit 270 has an input 272, an output 274, a first supply terminal 276, and a second supply terminal 278. The first supply terminal 266 of the first inverting circuit 260 and the first supply terminal 276 of the second inverting circuit 270 are coupled to the upper rail 280. The second supply terminal 268 of the first inverting circuit 260 and the second supply terminal 278 of the second inverting circuit 270 are coupled to the lower rail 285 (e.g., ground).

The first switch 290 is coupled between the input 272 of the second inverting circuit 270 and the output 264 of the first inverting circuit 260, and the second switch 295 is coupled between the input 262 of the first inverting circuit 260 and the output 274 of the second inverting circuit 270. When the first switch 290 and the second switch 295 are turned on, the first inverting circuit 260 and the second inverting circuit 270 are crossed coupled, in which the input 272 of the second inverting circuit 270 is coupled to the output 264 of the first inverting circuit 260 through the first switch 290, and the input 262 of the first inverting circuit 260 is coupled to the output 274 of the second inverting circuit 270 through the second switch 295. As discussed further below, the first switch 290 and the second switch 295 are turned on during the regeneration phase to enable regenerative feedback of the first inverting circuit 260 and the second inverting circuit 270, and the first switch 290 and the second switch 295 are turned off during the reset phase to disable regenerative feedback of the first inverting circuit 260 and the second inverting circuit 270. Each of the first switch 290 and the second switch 295 may be implemented with a respective transistor (e.g., respective NFET), a respective transmission gate, or another type of switch.

The first input transistor 250 is coupled between the input 272 of the second inverting circuit 270 and the lower rail 285. The gate of the first input transistor 250 is coupled to the first input 160 of the regeneration circuit 150. Thus, the gate of the first input transistor 250 is configured to receive the first voltage DINT (i.e., the first input signal to the regeneration circuit 150). In one example, the first input transistor 250 is configured to turn on when the voltage DINT is above a threshold voltage of the first input transistor 250 and turn off when the voltage DINT is below the threshold voltage of the first input transistor 250. In the example shown in FIG. 2B, the first input transistor 250 is implemented with an NFET, in which the drain of the first input transistor 250 is coupled to the input 272 of the second inverting circuit 270 and the source of the first input transistor 250 is coupled to the lower rail 285. Also, the first switch 290 is coupled between the output 264 of the first inverting circuit 260 and the drain of the first input transistor 250. It is to be appreciated that the first input transistor 250 may also be implemented with another type of transistor. In this example, the first output 170 is coupled to the output 264 of the first inverting circuit 260.

The second input transistor 255 is coupled between the input 262 of the first inverting circuit 260 and the lower rail 285. The gate of the second input transistor 255 is coupled to the second input 165 of the regeneration circuit 150. Thus, the gate of the second input transistor 255 is configured to receive the second voltage NDINT (i.e., the second input signal to the regeneration circuit 150). In one example, the second input transistor 255 is configured to turn on when the voltage NDINT is above a threshold voltage of the second input transistor 255 and turn off when the voltage NDINT is below the threshold voltage of the second input transistor 255. In the example shown in FIG. 2B, the second input transistor 255 is implemented with an NFET, in which the drain of the second input transistor 255 is coupled to the input 262 of the first inverting circuit 260 and the source of the second input transistor 255 is coupled to the lower rail 285. Also, the second switch 295 is coupled between the output 274 of the second inverting circuit 270 and the drain of the second input transistor 255. It is to be appreciated that the second input transistor 255 may also be implemented with another type of transistor. In this example, the second output 175 is coupled to the output 274 of the second inverting circuit 270.

In the example in FIG. 2B, the first switch 290 has a control input 292 driven by the timing signal, and the second switch 295 has a control input 297 driven by the timing signal (e.g., the clock signal CLK). In one example, the first switch 290 and the second switch 295 are configured to turn on when the timing signal is high and turn off when the timing signal is low. Thus, in this example, the first switch 290 and the second switch 295 turn on when the first switch 230 in the input circuit 120 turns on, and the first switch 290 and the second switch 295 turn off when the second switch 240 and the third switches 245 in the input circuit 120 turn on. For the example where each of the first switch 290 and the second switch 295 is implemented with a respective transistor, the control input 292 and 297 of each of the first switch 290 and the second switch 295 is located at the gate of the respective transistor. In one example, each of the first switch 290 and the second switch 295 may be implemented with a respective NFET.

Exemplary operations of the sampler 110 will now be discussed according to certain aspects.

When the timing signal (e.g., the clock signal CLK) is low, the sampler 110 is in the reset phase. In the reset phase, the first switch 230 in the input circuit 120 is turned off. As a result, the first switch 230 decouples the first input transistor 210 and the second input transistor 220 of the input circuit 120 from the lower rail 285 (e.g., ground). The second switch 240 and the third switch 245 are turned on. As a result, the second switch 240 couples the first output 140 to the upper rail 280 and the third switch 245 couples the second output 145 to the upper rail 280. This causes the input circuit 120 to pull up the first output 140 and the second output 145 to the supply voltage VCC on the upper rail 280. Thus, the first voltage DINT input to the gate of the first input transistor 250 of the regeneration circuit 150 and the second voltage NDINT input to the gate of the second input transistor 255 of the regeneration circuit 150 are both pulled up to VCC during the reset phase.

Also, in the reset phase, the first switch 290 and the second switch 295 in the regeneration circuit 150 are turned off. As a result, the regeneration feedback in the regeneration circuit 150 is disabled (i.e., the cross-coupling of the inverting circuits 260 and 270 is broken). In addition, the first input transistor 250 and the second input transistor 255 of the regeneration circuit 150 are both turned on since the voltage DINT and the voltage NDINT are both pulled up to the supply voltage VCC (assuming VCC is greater than the threshold voltage of the first input transistor 250 and the threshold voltage of the second input transistor 255). As a result, the inputs 262 and 272 of the inverting circuits 260 and 270 are pulled low (e.g., ground). This causes the outputs 264 and 274 of the inverting circuits 260 and 270 to be pulled high. In this example, the first output 170 and the second output 175 of the regeneration circuit 150 are also pulled high.

Figure 3A:
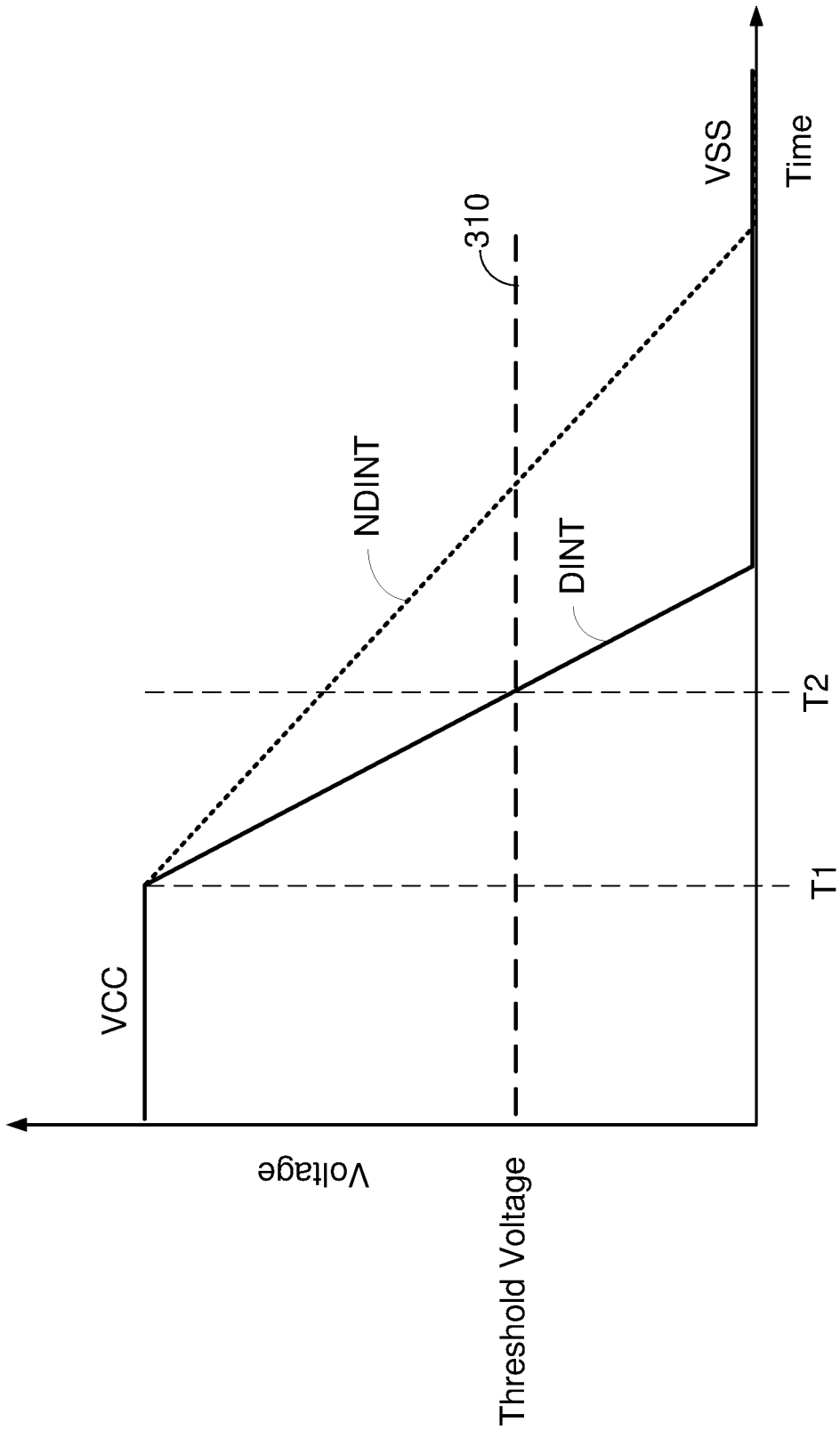
FIG. 3A is a timing diagram showing an example of voltages output by the input circuit to the regeneration circuit according to certain aspects of the present disclosure.

When the timing signal (e.g., the clock signal CLK) transitions from low to high, the sampler 110 transitions to the regeneration phase during which the input circuit 120 senses the differential input signal (e.g., differential data signal) at the inputs 130 and 135 of the input circuit 120. FIG. 3A shows an example of the voltages DINT and NDINT during the regeneration phase for the case where the input voltage INP is higher than the input voltage INN, which may represent a bit value of one. In this example, the timing signal (e.g., the clock signal CLK) transitions from low to high at time T1. Also, in this example, the first input transistor 250 and the second input transistor 255 have the same threshold voltage 310, which is shown in FIG. 3.

At time T1, the first switch 230 turns on, and the second switch 240 and the third switch 245 turn off. This allows the first input transistor 210 to pull down the voltage DINT based on the input voltage INP at the first input transistor 210, and the second input transistor 220 to pull down the voltage NDINT based on the input voltage INN at the second input transistor 220. In this example, the voltage DINT is pulled down (i.e., at a faster rate than the voltage NDINT. This is because the first input transistor 210 is driven by a higher voltage than the second input transistor 220 in this example (i.e., INP>INN).

At time T2, the voltage DINT falls below the threshold voltage 310, which turns off the first input transistor 250 of the regeneration circuit 150. The second input transistor 255 of the regeneration circuit 150 is still turned on at time T2 since the voltage NDINT is still above the threshold voltage at time T2. Starting at time T2, the regenerative feedback of the regeneration circuit 150 pulls up the first output 170 and pulls down the second output 175 (e.g., pulls the first output 170 towards the supply voltage VCC and pulls the second output 175 towards ground). The pulling up of the first output 170 and the pulling down of the second output 175 generates a differential output voltage at the outputs 170 and 175 in which the output voltage OUTP is higher than the output voltage OUTN, which may represent a bit value of one.

Figure 3B:
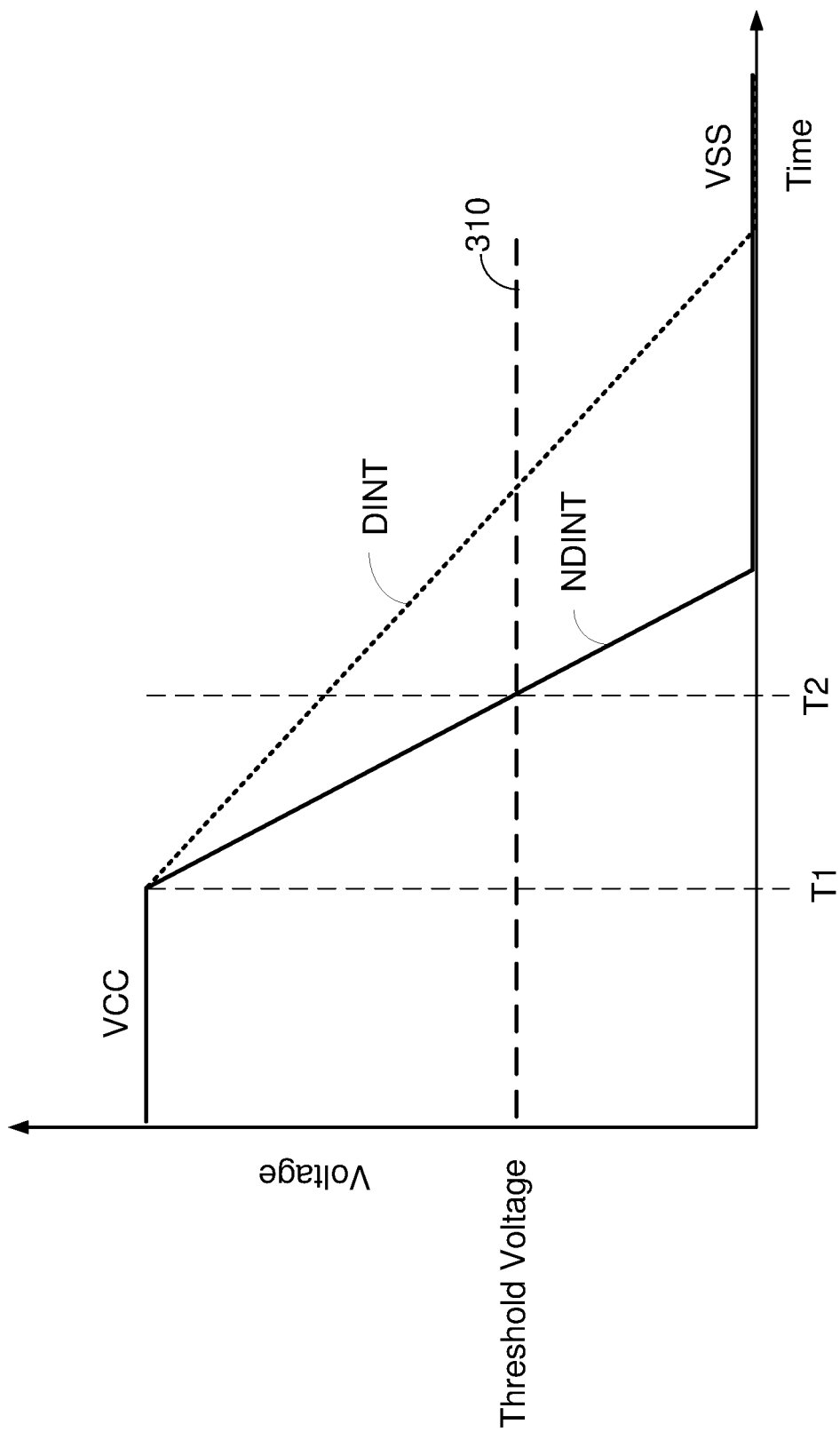
FIG. 3B is a timing diagram showing another example of voltages output by the input circuit to the regeneration circuit according to certain aspects of the present disclosure.

FIG. 3A shows the voltages DINT and NDINT for the case where the input voltage INP is higher than the input voltage INN. FIG. 3B shows an example of the voltages DINT and NDINT for the case where the input voltage INN is higher than the input voltage INP. In this case, the voltage NDINT at the second output 145 of the input circuit 120 falls at a faster rate during the regeneration phase than the voltage DINT at the first output 140 of the input circuit 120. As a result, the voltage NDINT falls below the threshold voltage 310 before the voltage DINT, causing the second input transistor 255 to turn off before the first input transistor 250. When this occurs, the regenerative feedback of the regeneration circuit 150 pulls up the second output 175 and pulls down the first output 170, resulting in a large differential output voltage in which the output voltage OUTN is higher than the output voltage OUTP, which may represent a bit decision of zero.

In both cases, it is desirable for the regeneration circuit 150 to quickly generate a large differential output voltage at the outputs 170 and 175 during the regeneration phase to quickly resolve (i.e., capture) a bit value. A latch (e.g., SR latch) coupled to the outputs 170 and 175 of the regeneration circuit 150 may latch the resolved bit value, as discussed above. When the timing signal transitions from high back to low, the sampler 110 reenters the reset phase to reset the sampler 110 for the next bit value.

As discussed above, in the example in FIG. 2B, the first switch 290 and the second switch 295 are used to enable regenerative feedback of the first inverting circuit 260 and the second inverting circuit 270 during the regeneration phase, and disable regenerative feedback of the first inverting circuit 260 and the second inverting circuit 270 during the reset phase. The first switch 290 and the second switch 295 disable the regenerative feedback during the reset phase by breaking the cross-coupling of the first inverting circuit 260 and the second inverting circuit 270 when the first switch 290 and the second switch 295 are turned off. However, it is to be appreciated that the present disclosure is not limited to this example. In general, regenerative feedback of the first inverting circuit 260 and the second inverting circuit 270 may be enabled or disabled using one or more switches placed at one or more locations in the regeneration circuit 150, in which the one or more switches are controlled by a timing signal (e.g., the clock signal CLK).

Figure 2C:
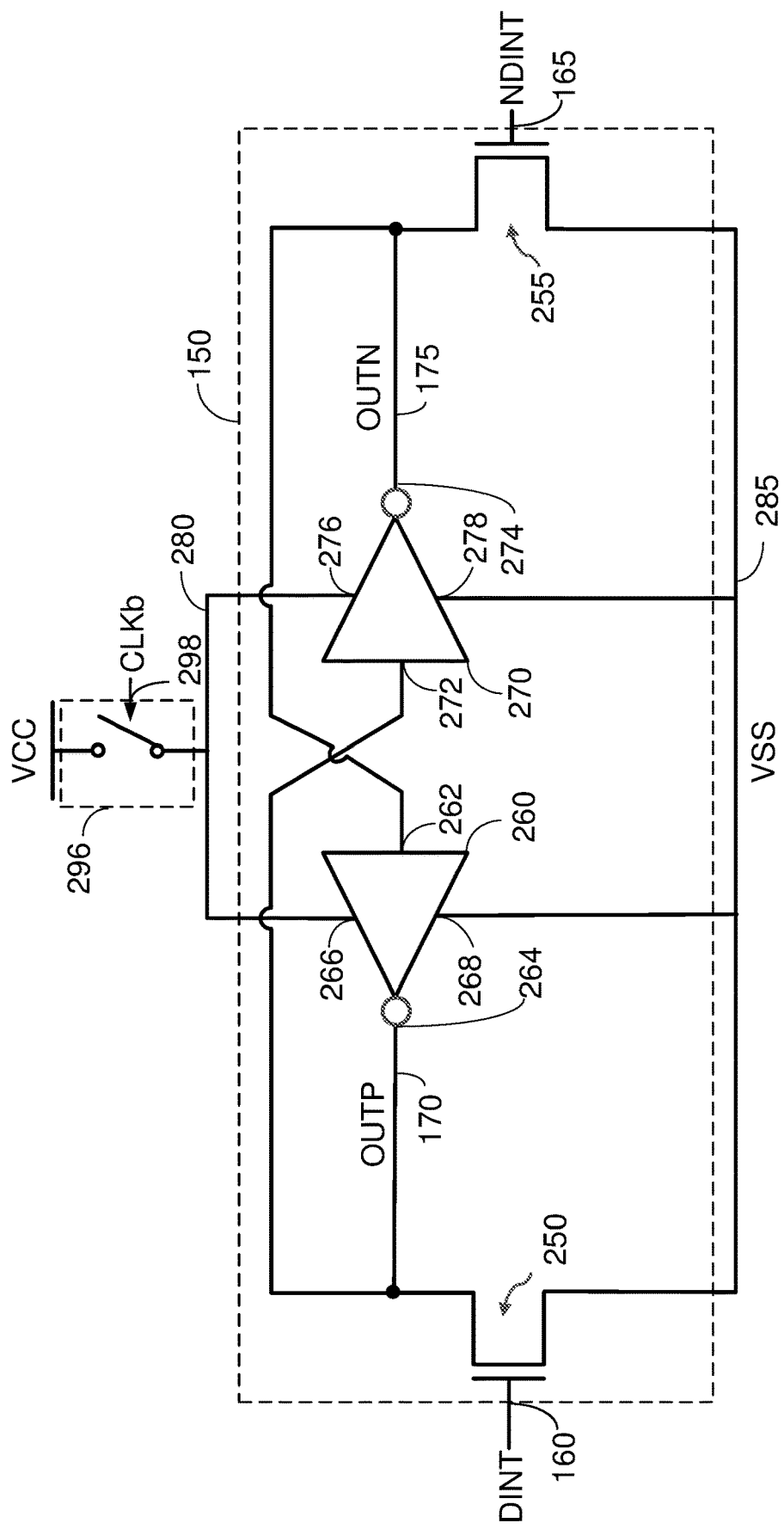
FIG. 2C shows another exemplary implementation of the regeneration circuit according to certain aspects of the present disclosure.

In this regard, FIG. 2C shows an exemplary implementation in which the regeneration circuit 150 includes a switch 296 coupled between the upper rail 280 and the supply terminals 266 and 276 of the inverting circuits 260 and 270. In this example, the first switch 290 and the second switch 295 shown in FIG. 2B are omitted, in which the output 264 of the first inverting circuit 260 is coupled to the first input transistor 250, and the output 274 of the second inverting circuit 270 is coupled to the second input transistor 255. The switch 296 may be implemented with a PFET and has a control input 298 driven by the inverse of the timing signal (e.g., inverse clock signal CLKb). In this example, the switch 296 is configured to turn off during the reset phase and turn on during the regeneration phase. Turning off the switch 296 during the reset phase removes power to the inverting circuits 260 and 270 from the upper rail 280, which disables the regenerative feedback of the first inverting circuit 260 and the second inverting circuit 270. It is to be appreciated that the present disclosure is not limited to the examples shown in FIGS. 2B and 2C.

Figure 4:
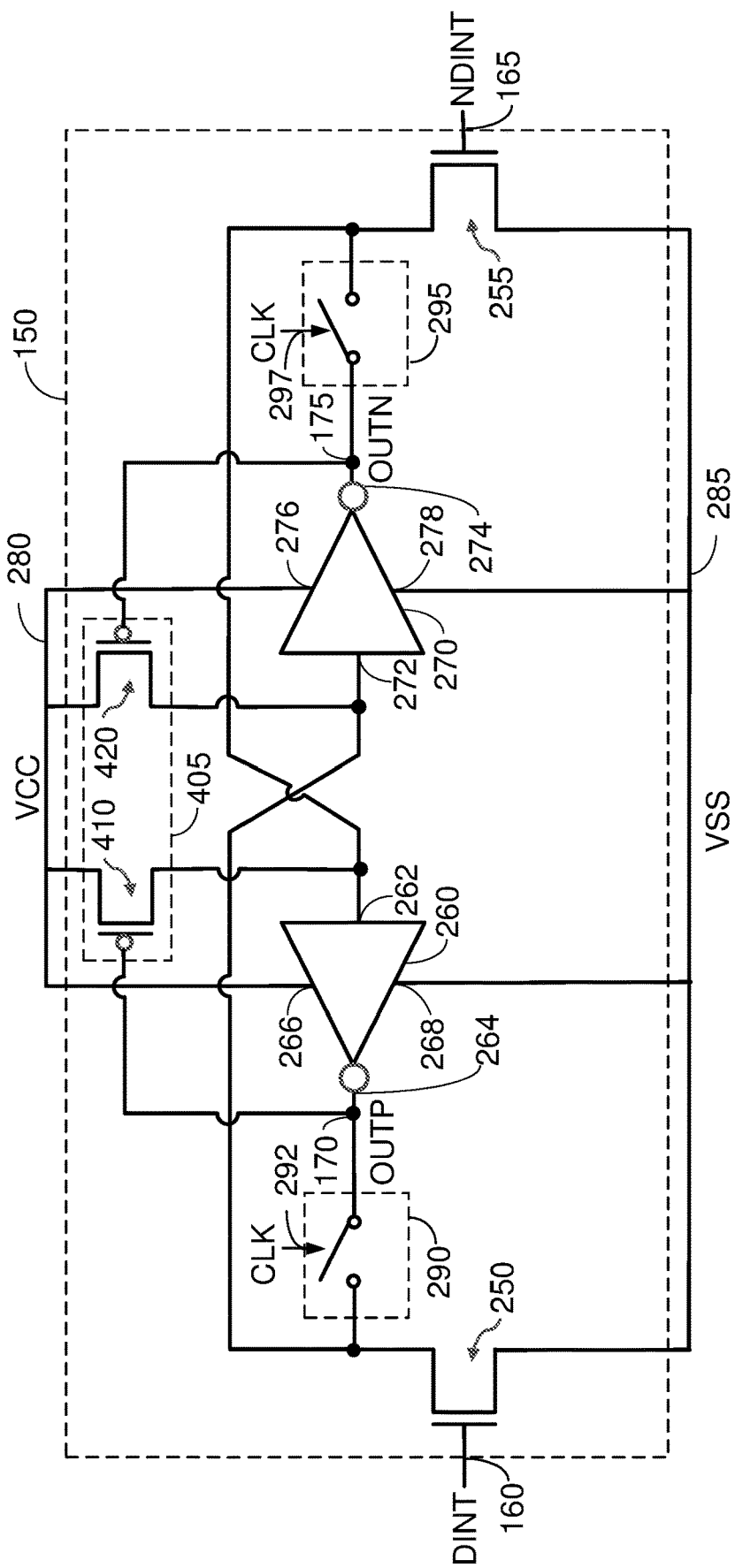
FIG. 4 shows an example of the regeneration circuit including a pull-up circuit according to certain aspects of the present disclosure.

FIG. 4 shows an example in which the regeneration circuit 150 further includes a pull-up circuit 405 according to certain aspects. The pull-up circuit 405 is configured to provide an additional pull-up path during the regeneration phase to increase the regenerative gain of the regeneration circuit 150. The pull-up circuit 405 includes a first pull-up transistor 410 and a second pull-up transistor 420 according to certain aspects of the present disclosure.

In the example in FIG. 4, the first pull-up transistor 410 is implemented with a first PFET and the second pull-up transistor 420 is implemented with a second PFET. The source of the first pull-up transistor 410 is coupled to the rail 280, the drain of the first pull-up transistor 410 is coupled to the input 262 of the first inverting circuit 260, and the gate of the first pull-up transistor 410 is coupled to the output 264 of the first inverting circuit 260. The source of the second pull-up transistor 420 is coupled to the rail 280, the drain of the second pull-up transistor 420 is coupled to the input 272 of the second inverting circuit 270, and the gate of the second pull-up transistor 420 is coupled to the output 274 of the second inverting circuit 270.

Exemplary operations of the pull-up circuit 405 will now be discussed according to certain aspects.

When the voltage DINT falls faster than the voltage NDINT during the regeneration phase (e.g., INP>INN at the inputs 130 and 135 of the input circuit 120), the first input transistor 250 turns off before the second input transistor 255. This triggers the regenerative feedback of the regeneration circuit 150 to pull up the first output 170 and pull down the second output 175. The pulling down of the second output 175 turns on the second pull-up transistor 420 since the gate of the second pull-up transistor 420 is coupled to the second output 175. This causes the second pull-up transistor 420 to pull up the input 272 of the second inverting circuit 270 toward the supply voltage VCC on the rail 280, which helps the second inverting circuit 270 drive the output 274 of the second inverting circuit 270 low. Since the output 274 of the second inverting circuit 270 is coupled to the second output 175, driving the output 274 of the second inverting circuit 270 low helps further pull down the second output 175, thereby increasing the regenerative gain of the regeneration circuit 150. Thus, in this case, the pull-up circuit 405 provides an additional pull-up path between the rail 280 and the input 272 of the second inverting circuit 270 during the regeneration phase, which increases the regenerative gain.

When the voltage NDINT falls faster than the voltage DINT during the regeneration phase (e.g., INN>INP at the inputs 130 and 135 of the input circuit 120), the second input transistor 255 turns off before the first input transistor 250. This triggers the regenerative feedback of the regeneration circuit 150 to pull up the second output 175 and pull down the first output 170. The pulling down of the first output 170 turns on the first pull-up transistor 410 since the gate of the first pull-up transistor 410 is coupled to the first output 170. This causes the first pull-up transistor 410 to pull up the input 262 of the first inverting circuit 260 toward the supply voltage VCC on the rail 280, which helps the first inverting circuit 260 drive the output 264 of the first inverting circuit 260 low. Since the output 264 of the first inverting circuit 260 is coupled to the first output 170, driving the output 264 of the first inverting circuit 260 lower helps further pull down the first output 170, thereby increasing the regenerative gain of the regeneration circuit 150. Thus, in this case, the pull-up circuit 405 provides an additional pull-up path between the rail 280 and the input 262 of the first inverting circuit 260 during the regeneration phase, which increases the regenerative gain.

Thus, the pull-up circuit 405 is configured to provide an additional pull-up path during the regeneration phase to increase the regenerative gain of the regeneration circuit 150. The pull-up path is between the rail 280 and the input 272 of the second inverting circuit 270 when the voltage DINT falls faster than the voltage NDINT (e.g., INP>INN), and the pull-up path is between the rail 280 and the input 262 of the first inverting circuit 260 when the voltage NDINT falls faster than the voltage DINT (e.g., INN>INP).

Figure 5A:
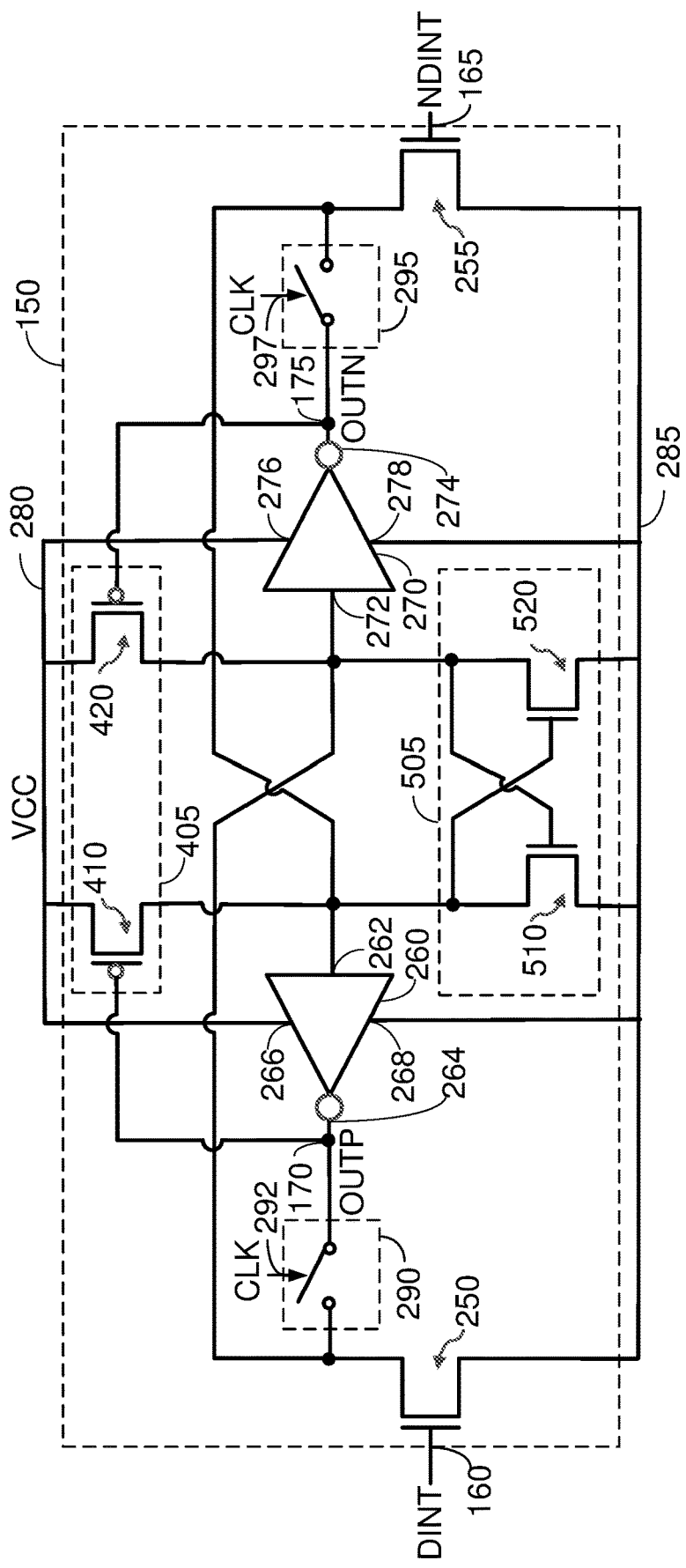
FIG. 5A shows an example of the regeneration circuit including a pull-down circuit according to certain aspects of the present disclosure.

To further increase the regenerative gain of the regeneration circuit 150, a pull-down circuit may be added to the regeneration circuit 150. In this regard, FIG. 5A shows an example in which the regeneration circuit 150 further includes a pull-down circuit 505 according to certain aspects. The pull-down circuit 505 is configuration to provide an additional pull-down path during the regeneration phase to increase the regenerative gain of the regeneration circuit 150, which increases the signal strength at the outputs 170 and 175 of the regeneration circuit 150. The pull-down circuit 505 may be used in combination with the pull-up circuit 405 to increase regenerative gain, as discussed further below. The pull-down circuit 505 includes a first pull-down transistor 510 and a second pull-down transistor 520 according to certain aspects of the present disclosure.

In the example in FIG. 5A, the first pull-down transistor 510 is implemented with a first NFET and the second pull-down transistor 520 is implemented with a second NFET. The drain of the first pull-down transistor 510 is coupled to the input 262 of the first inverting circuit 260, the source of the first pull-down transistor 510 is coupled to the lower rail 285 (e.g., ground), and the gate of the first pull-down transistor 510 is coupled to the input 272 of the second inverting circuit 270 and the first output 170. The drain of the second pull-down transistor 520 is coupled to the input 272 of the second inverting circuit 270, the source of the second pull-down transistor 520 is coupled to the lower rail 285, and the gate of the second pull-down transistor 520 is coupled to the input 262 of the first inverting circuit 260 and the second output 175. In other words, the first pull-down transistor 510 and the second pull-down transistor 520 are cross-coupled.

Exemplary operations of the pull-down circuit 505 will now be discussed according to certain aspects.

When the voltage DINT falls faster than the voltage NDINT during the regeneration phase (e.g., INP>INN at the inputs 130 and 135 of the input circuit 120), the first input transistor 250 turns off before the second input transistor 255. This triggers the regenerative feedback of the regeneration circuit 150 to pull up the first output 170 and pull down the second output 175. The pulling up of the first output 170 turns on the first pull-down transistor 510 since the gate of the first pull-down transistor 510 is coupled to the first output 170. This causes the first pull-down transistor 510 to pull down the input 262 of the first inverting circuit 260, which helps the first inverting circuit 260 drive the output 264 high. Since the output 264 of the first inverting circuit 260 is coupled to the first output 170, driving the output 264 of the first inverting circuit 260 high helps further pull up the first output 170, thereby increasing regenerative gain. Thus, in this case, the pull-down circuit 505 provides an additional pull-down path between the input 262 of the first inverting circuit 260 and the lower rail 285 (e.g., ground) during the regeneration phase, which increases the regenerative gain.

When the voltage NDINT falls faster than the voltage DINT during the regeneration phase (e.g., INN>INP at the inputs 130 and 135 of the input circuit 120), the second input transistor 255 turns off before the first input transistor 250. This triggers the regenerative feedback of the regeneration circuit 150 to pull up the second output 175 and pull down the first output 170. The pulling up of the second output 175 turns on the second pull-down transistor 520 since the gate of the second pull-down transistor 520 is coupled to the second output 175. This causes the second pull-down transistor 520 to pull down the input 272 of the second inverting circuit 270, which helps the second inverting circuit 270 drive the output 274 high. Since the output 274 of the second inverting circuit 270 is coupled to the second output 175, driving the output 274 of the second inverting circuit 270 high helps further pull up the second output 175, thereby increasing regenerative gain. Thus, in this case, the pull-down circuit 505 provides an additional pull-down path between the input 272 of the second inverting circuit 270 and the lower rail 285 (e.g., ground) during the regeneration phase, which increases the regenerative gain.

Thus, the pull-down circuit 505 is configured to provide an additional pull-down path during the regeneration phase to increase the regenerative gain of the regeneration circuit 150. The pull-down path is between the input 262 of the first inverting circuit 260 and the lower rail 285 (e.g., ground) when the voltage DINT falls faster than the voltage NDINT (e.g., INP>INN), and the pull-down path is between the input 272 of the second inverting circuit 270 when the voltage NDINT falls faster than the voltage DINT (e.g., INN>INP).

The pull-down circuit 505 may be used in combination with the pull-up circuit 405 to increase the regenerative gain of the regeneration circuit 150, which increases the signal strength at the outputs 170 and 175 of the regeneration circuit 150. For example, when the voltage DINT falls faster than the voltage NDINT (e.g., INP>INN), the pull-up circuit 405 provides an additional pull-up path for pulling up the input 272 of the second inverting circuit 270 while the pull-down circuit 505 provides an additional pull-down path for pulling down in the input 262 of the first inverting circuit 260. When the voltage NDINT falls faster than the voltage DINT (e.g., INN>INP), the pull-up circuit 405 provides an additional pull-up path for pulling up the input 262 of the first inverting circuit 260 while the pull-down circuit 505 provides an additional pull-down path for pulling down in the input 272 of the second inverting circuit 270. Thus, in these aspects, the pull-up circuit 405 pulls up the input of one of the inverting circuits 260 and 270 and the pull-down circuit 505 pulls down the input of the other one of the inverting circuits 260 and 270 depending on which one of the voltages DINT and NDINT falls faster, which, in turn, depends on the input voltages INP and INN of the input circuit 120.

Another advantage of the pull-up circuit 405 and the pull-down circuit 505 is that they continue to provide regenerative gain during a first portion of the reset phase before the input transistors 250 and 255 are turned on (i.e., before the input circuit 120 raises the voltages DINT and NDINT above the threshold voltage of the input transistors 250 and 255). This is because the pull-up circuit 405 and the pull-down circuit 505 continue to provide the additional pull-up path and additional pull-down path even when the switches 290 and 295 are turned off by the timing signal (e.g., the clock signal CLK). The continued regenerative gain during the first portion of the reset phase allows the differential output voltage of the regeneration circuit 150 to continue to increase for better resolving the corresponding bit value.

Figure 5B:
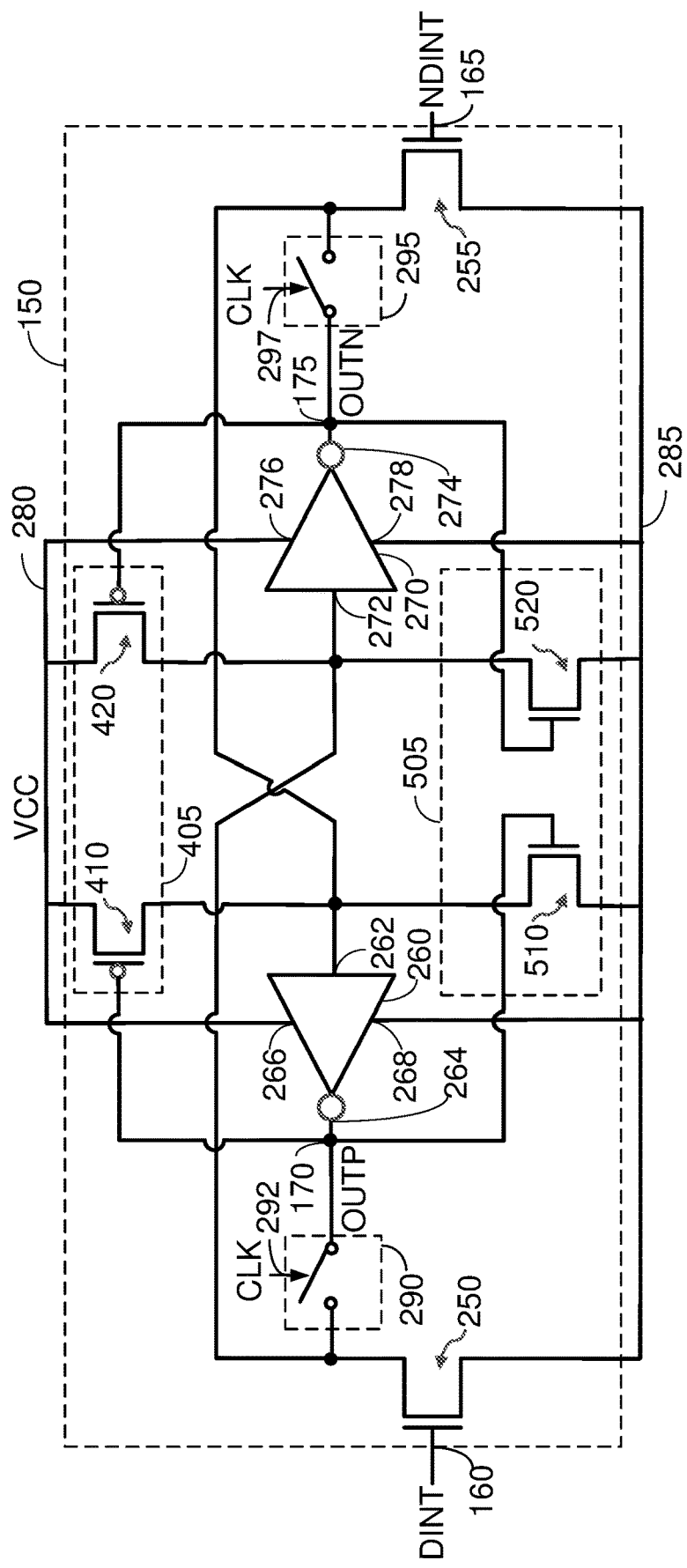
FIG. 5B shows another example of the regeneration circuit including a pull-down circuit according to certain aspects of the present disclosure.

It is to be appreciated that the pull-down circuit 505 is not limited to the exemplary implementation shown in FIG. 5A. In this regard, FIG. 5B shows another exemplary implementation in which the gate of the first pull-down transistor 510 is coupled to the output 264 of the first inverting circuit 260, and the gate of the second pull-down transistor 520 is coupled to the output 274 of the second inverting circuit 270. Similar to the exemplary implementation shown in FIG. 5A, the pull-down transistors 510 and 520 in this example provide an additional pull-down path to increase regenerative gain.

As discussed above, the pull-up circuit 405 increases regenerative gain of the regeneration circuit 150 by providing an additional pull-up path during the regeneration phase. The strength of the pull-up path may be increased to further increase the regenerative gain of the regeneration circuit 150 by increasing the sizes (e.g., channel widths) of the pull-up transistors 410 and 420. However, increasing the sizes of the pull-up transistors 410 and 420 increases the reset time of the regeneration circuit 150 resulting in a tradeoff between regeneration and reset, as discussed further below.

At the beginning of the reset phase, the input circuit 120 raises the voltages DINT and NDINT, which are input to the input transistors 250 and 255 of the regeneration circuit 150. When the voltages DINT and NDINT rise to the threshold voltage of the input transistors 250 and 255, the input transistors 250 and 255 turn on to pull both inputs 262 and 272 of the inverting circuits 260 and 270 low. However, one of the pull-up transistors 410 and 420 is initially on and fights the ability of the input transistors 250 and 255 to pull both inputs 262 and 272 of the inverting circuits 260 and 270 low, which increases the reset time. Increasing the sizes of the pull-up transistors 410 and 420 to further increase regenerative gain exacerbates this problem by making it harder for the input transistors 250 and 255 to pull both inputs 262 and 272 of the inverting circuits 260 and 270 low to reset the regeneration circuit 150. Thus, there is a tradeoff between regeneration and reset associated with the pull-up transistors 410 and 420.

Figure 6:
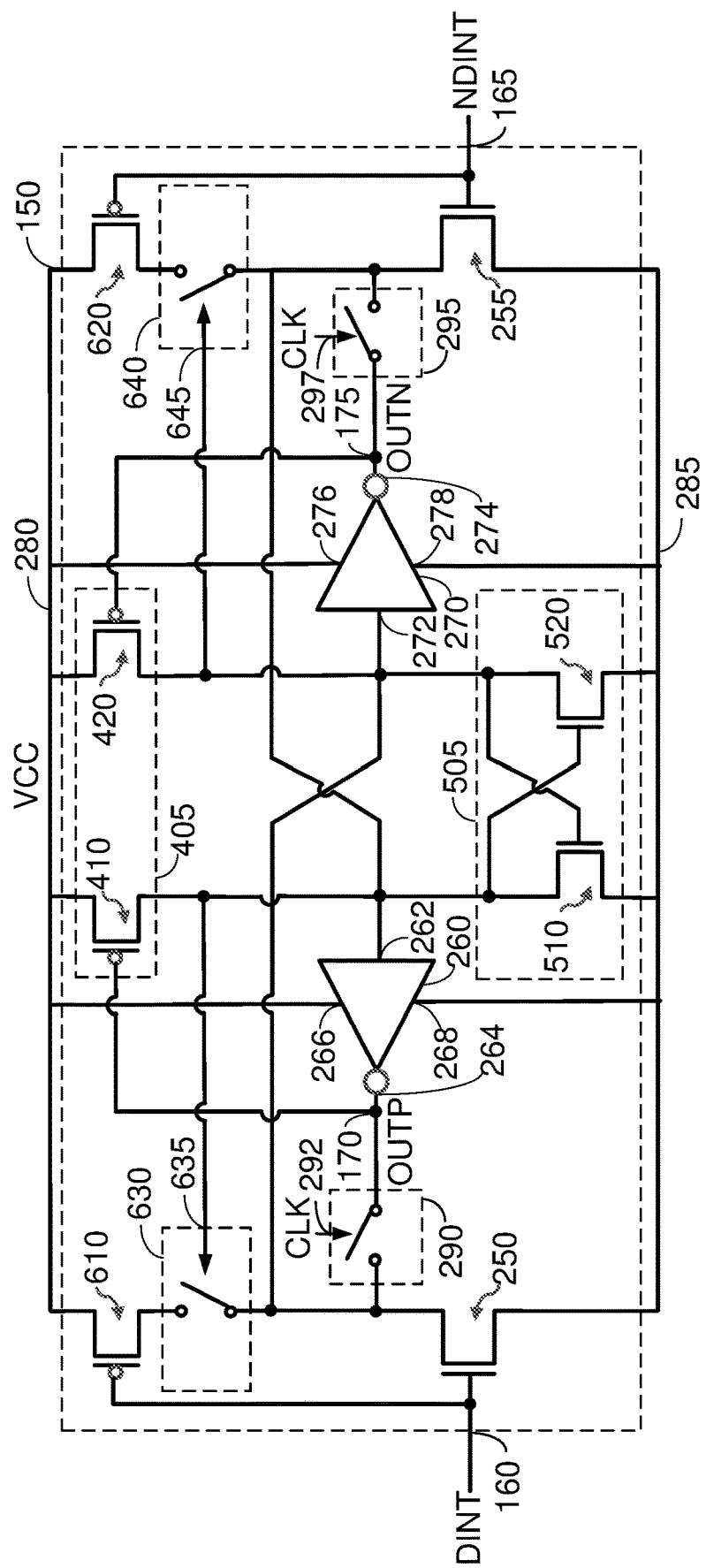
FIG. 6 shows an example of the regeneration circuit including input transistors providing a pull-up path according to certain aspects of the present disclosure.

To address the above, FIG. 6 shows an example in which the regeneration circuit 150 further includes a third input transistor 610 and a fourth input transistor 620, which mitigate the tradeoff between regeneration and reset, and increase sensitivity, as discussed further below. In this example, the regeneration circuit 150 also includes a third switch 630 and a fourth switch 640.

The gate of the third input transistor 610 is coupled to the first input 160 of the regeneration circuit 150, and therefore receives the first voltage DINT. The third input transistor 610 and the third switch 630 are coupled in series between the rail 280 and the first output 170 of the regeneration circuit 150. In the example in FIG. 6, the third input transistor 610 is implemented with a respective PFET, in which the source of the third input transistor 610 is coupled to the rail 280, and the third switch 630 is coupled between the drain of the third input transistor 610 and the first input transistor 250. For the example where the third input transistor 610 is implemented with a respective PFET, the third input transistor 610 may be configured to turn on when the first voltage DINT falls below VCC−Vt3 where Vt3 is the threshold voltage of the third input transistor 610.

The third switch 630 has a control input 635 coupled to the input 262 of the first inverting circuit 260. In certain aspects, the third switch 630 is configured to turn on when the voltage at the control input 635 is below a threshold of the third switch 630, and turn off when the voltage at the control input 635 is above the threshold of the third switch 630, as discussed further below. The third switch 630 may be implemented with a respective PFET or another type of switch.

The gate of the fourth input transistor 620 is coupled to the second input 165 of the regeneration circuit 150, and therefore receives the second voltage NDINT. The fourth input transistor 620 and the fourth switch 640 are coupled in series between the rail 280 and the second output 175 of the regeneration circuit 150. In the example in FIG. 6, the fourth input transistor 620 is implemented with a respective PFET, in which the source of the fourth input transistor 620 is coupled to the rail 280, and the fourth switch 640 is coupled between the drain of the fourth input transistor 620 and the second input transistor 255. For the example where the fourth input transistor 620 is implemented with a respective PFET, the fourth input transistor 620 may be configured to turn on when the second voltage NDINT falls below VCC−Vt4 where Vt4 is the threshold voltage of the fourth input transistor 620. In certain aspects Vt3 and Vt4 may be approximately equal.

The fourth switch 640 has a control input 645 coupled to the input 272 of the second inverting circuit 270. In certain aspects, the fourth switch 640 is configured to turn on when the voltage at the control input 645 is below a threshold of the fourth switch 640, and turn off when the voltage at the control input 645 is above the threshold of the fourth switch 640, as discussed further below. The fourth switch 640 may be implemented with a respective PFET or another type of switch.

Exemplary operations of the exemplary regeneration circuit 150 shown in FIG. 6 will now be discussed according to certain aspects.

During the reset phase, the input circuit 120 pulls the voltages DINT and NDINT to the supply voltage VCC, as discussed above. This causes the first input transistor 250 and the second input transistor 255 of the regeneration circuit 150 to turn on and pull the inputs 262 and 272 of the inverting circuits 260 and 270 low. This also causes the third and fourth input transistors 610 and 620 of the regeneration circuit 150 to turn off since these transistors are implemented with PFETs in this example. Thus, in this example, the inputs 262 and 272 of the inverting circuits 260 and 270 are reset low (e.g., approximately ground). In addition, both the third switch 630 and the fourth switch 640 are turned on. This is because the input transistors 610 and 620 pull the control inputs 635 and 645 of the third and fourth switches 630 and 640 low during the reset phase.

When the sampler 110 transitions to the regeneration phase, the timing signal (e.g., the clock signal CLK) turns on the first switch 290 and the second switch 295, enabling the regenerative feedback loop through the inverting circuits 260 and 270. At the start of the regeneration phase, both the first input transistor 250 and the second input transistor 255 are on, and both the third and fourth input transistors 610 and 620 are off. In addition, both the third switch 630 and the fourth switch 640 are on.

For the case where the input voltage INP is higher than the input voltage INN, the first voltage DINT falls (i.e., discharges) at a faster rate than the second voltage NDINT. This causes the first input transistor 250 to turn off before the second input transistor 255, and causes the third input transistor 610 to turn on before the fourth input transistor 620. The turning off of the first input transistor 250 triggers the regenerative feedback of the regeneration circuit 150 to pull up the first output 170 and pull down the second output 175 (e.g., pull the first output 170 towards the supply voltage VCC and pull the second output 175 towards ground). The turning on of the third input transistor 610 causes the third input transistor 610 to pull up the first output 170 through the third switch 630 (which is turned on). Thus, in this case, the third input transistor 610 and the third switch 630 provide an additional pull-up path for pulling up the first output 170, which increases regenerative gain.

The pulling up of the first output 170 turns off the fourth switch 640 since the control input 645 of the fourth switch 640 is coupled to the first output 170. This prevents the fourth input transistor 620 from pulling up the second output 175 when the fourth input transistor 620 eventually turns on (i.e., when NDINT falls below VCC-Vt4), allowing the regeneration of the regeneration circuit 150 to pull the second output 175 low.

For the case where the input voltage INN is higher than the input voltage INP, the second voltage NDINT falls (i.e., discharges) at a faster rate than the first voltage DINT. This causes the second input transistor 255 to turn off before the first input transistor 250, and causes the fourth input transistor 620 to turn on before the third input transistor 610. The turning off of the second input transistor 255 triggers the regenerative feedback of the regeneration circuit 150 to pull up the second output 175 and pull down the first output 170 (e.g., pull the second output 175 towards the supply voltage VCC and pull the first output 170 towards ground). The turning on of the fourth input transistor 620 causes the fourth input transistor 620 to pull up the second output 175 through the fourth switch 640 (which is turned on). Thus, in this case, the fourth input transistor 620 and the fourth switch 640 provide an additional pull-up path for pulling up the second output 175, which increases regenerative gain.

The pulling up of the second output 175 turns off the third switch 630 since the control input 635 of the third switch 630 is coupled to the second output 175. This prevents the third input transistor 610 from pulling up the first output 170 when the third input transistor 610 eventually turns on (i.e., when DINT falls below VCC-Vt3), allowing the regeneration of the regeneration circuit 150 to pull the first output 170 low.

Thus, the third input transistor 610 and the fourth input transistor 620 provide an additional pull-up path during the regeneration phase to increase the regenerative gain of the regeneration circuit 150. For the case where the voltage DINT falls faster than the voltage NDINT (e.g., INP>INN), the third input transistor 610 provides an additional pull-up path between the first output 170 and the rail 280 through the third switch 630. For the case where the voltage NDINT falls faster than the voltage DINT (e.g., INN>INP), the fourth input transistor 620 provides an additional pull-up path between the second output 175 and the rail 280 through the fourth switch 640.

The third input transistor 610 and the fourth input transistor 620 allow the regeneration circuit 150 to achieve a higher regenerative gain without having to increase the sizes (e.g., channel widths) of the first pull-up transistor 410 and the second pull-up transistor 420, which mitigates the tradeoff between regeneration and reset associated with the pull-up transistors 410 and 420. This is because the third input transistor 610 and the fourth input transistor 620 provide an additional pull-up path during the regeneration phase in parallel with the additional pull-up path provided by the pull-up transistors 410 and 420. This increases the pull-up strength of the regeneration in the regeneration circuit 150 without having to increase the sizes of the first pull-up transistor 410 and the second pull-up transistor 420.

In addition, the input circuit 120 turns off both the third input transistor 610 and the fourth input transistor 620 during the reset phase, allowing the first input transistor 250 and the second input transistor 255 to pull both inputs 262 and 272 of the inverting circuits 260 and 270 low during the reset phase to reset the regeneration circuit 150. This is because the input circuit 120 pulls the voltages DINT and NDINT to the supply voltage VCC during the reset phase, which turns off both the third input transistor 610 and the fourth input transistor 620. Once the input circuit 120 turns off the third input transistor 610 and the fourth input transistor 620 during the reset phase, these transistors no longer fight the ability of the first input transistor 250 and the second input transistor 255 to pull both inputs 262 and 272 of the inverting circuits 260 and 270 low during the reset phase. This further mitigates the tradeoff between regeneration and reset.

The third input transistor 610 and the fourth input transistor 620 also increases the sensitivity of the sampler 110. This is because the gates of the third input transistor 610 and the fourth input transistor 620 are driven by the voltages DINT and NDINT, respectively, which are generated based on the sensed input voltages INP and INN, respectively.

In the example shown in FIG. 6, the third switch 630 is coupled between the third input transistor 610 and the first input transistor 250. However, it is to be appreciated that the present disclosure is not limited to this example. For example, in some implementations, the third switch 630 may be coupled between the third input transistor 610 and the upper rail 280 with the third input transistor 610 coupled between the third switch 630 and the first input transistor 250. In general, the third input transistor 610 and the third switch 630 are coupled in series between the upper rail 280 and the first input transistor 250 with either the third input transistor 610 or the third switch 630 on top. Also, in some implementations, the fourth switch 640 may be coupled between the fourth input transistor 620 and the upper rail 280 with the fourth input transistor 620 coupled between the fourth switch 640 and the second input transistor 255. In general, the fourth input transistor 620 and the fourth switch 640 are coupled in series between the upper rail 280 and the second input transistor 255 with either the fourth input transistor 620 or the fourth switch 640 on top.

Figure 7:
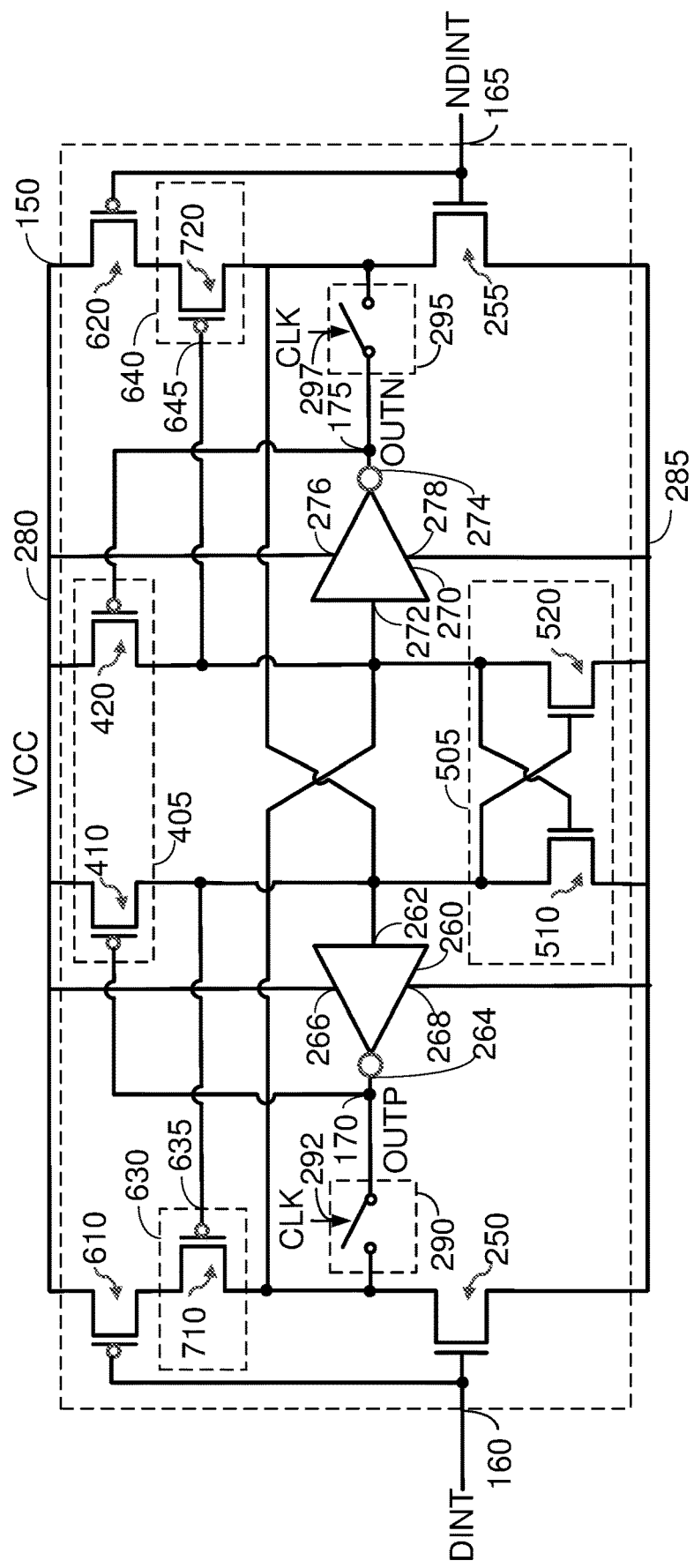
FIG. 7 shows an exemplary implementation of the input transistors according to certain aspects of the present disclosure.

FIG. 7 shows an exemplary implementation of the third switch 630 and the fourth switch 640. In this example, the third switch 630 is implemented with a first PFET 710 coupled between the drain of the third input transistor 610 and the first input transistor 250, in which the gate of the first PFET 710 is coupled to the input 262 of the first inverting circuit 260. Also, in this example, the fourth switch 640 includes a second PFET 720 coupled between the drain of the fourth input transistor 620 and the second input transistor 255, in which the gate of the second PFET 720 is coupled to the input 272 of the second inverting circuit 270. It is to be appreciated that the third switch 630 and the fourth switch 640 are not limited to the exemplary implementation shown in FIG. 7, and that each of the third switch 630 and the fourth switch 640 may be implemented with another type of transistor, a transmission gate, or another type of switch.

Figure 8:
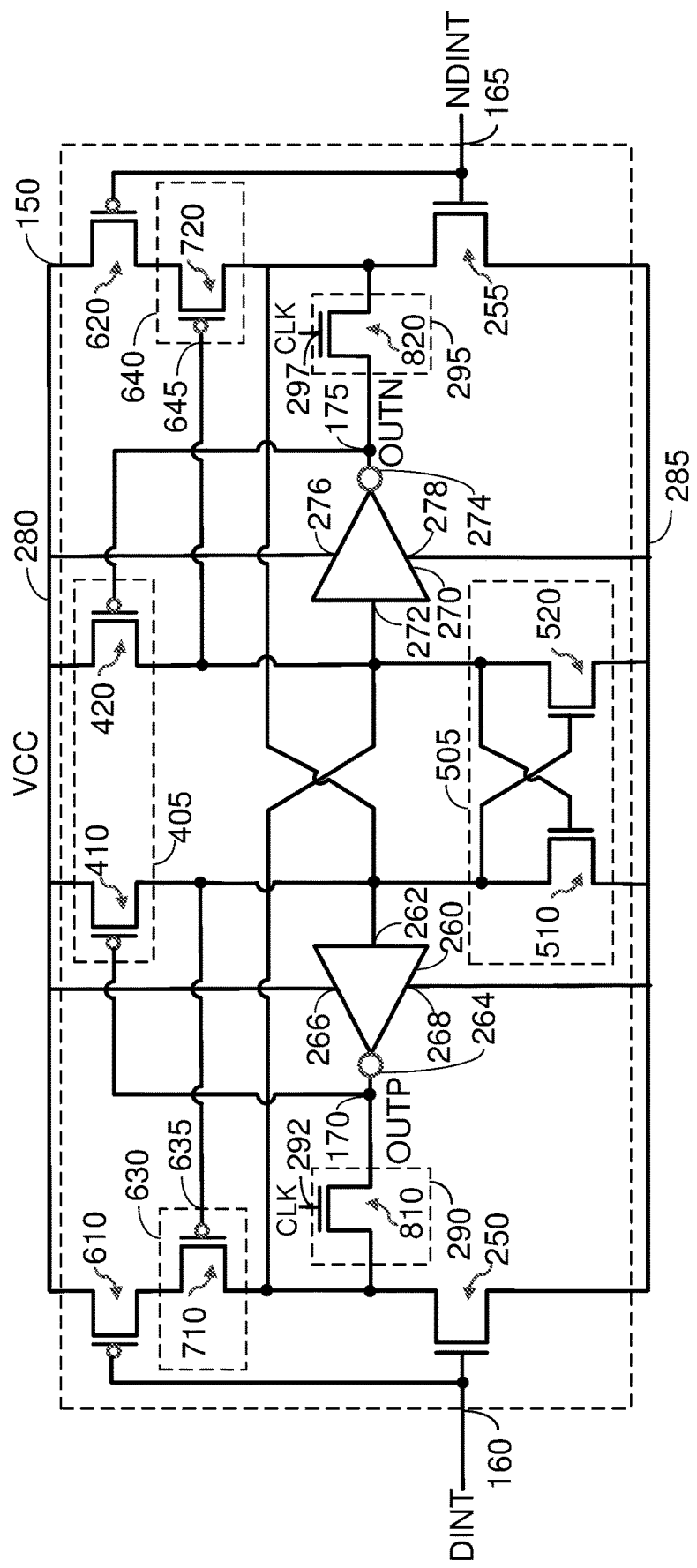
FIG. 8 shows an exemplary implementation of switches in the regeneration circuit according to certain aspects of the present disclosure.

FIG. 8 shows an example in which the first switch 290 is implemented with a first NFET 810, and the second switch 295 is implemented with a second NFET 820. In this example, one of the source and the drain of the first NFET 810 is coupled to the first input transistor 250 (e.g., the drain of the first input transistor 250), the other one of the source and the drain of the first NFET 810 is coupled to the output 264 of the first inverting circuit 260, and the gate of the first NFET 810 is coupled to the control input 292 to receive the timing signal (e.g., the clock signal CLK). One of the source and the drain of the second NFET 820 is coupled to the second input transistor 255 (e.g., the drain of the second input transistor 255), the other one of the source and the drain of the second NFET 820 is coupled to the output 274 of the second inverting circuit 270, and the gate of the second NFET 820 is coupled to the control input 297 to receive the timing signal (e.g., the clock signal CLK). In this example, the first switch 290 and the second switch 295 turn on when the timing signal is high and turn off when the timing signal is low. It is to be appreciated that the first switch 290 and the second switch 295 are not limited to the exemplary implementation shown in FIG. 8, and that each of the first switch 290 and the second switch 295 may be implemented with another type of transistor, a transmission gate, or another type of switch.

In the examples shown in FIGS. 4 to 8, the regeneration circuit 150 includes the first switch 290 and the second switch 295 for enabling the regenerative feedback of the inverting circuits 260 and 270 during the regeneration phase and disabling the regenerative feedback of the inverting circuits 260 and 270 during the reset phase. However, it is to be appreciated that the present disclosure is not limited to this example. For example, in other implementations, the switch 296 shown in FIG. 2C may be used to enable or disable the regenerative feedback of the inverting circuits 260 and 270 with the first switch 290 and the second switch 295 omitted. In this example, the output 264 of the first inverting circuit 260 is coupled to the first input transistor 250, and the output 274 of the second inverting circuit 270 is coupled to the second input transistor 255. In general, one or more switches may be placed at one or more locations in the regeneration circuit 150 to enable or disable the regenerative feedback of the inverting circuits 260 and 270.

Figure 9B:
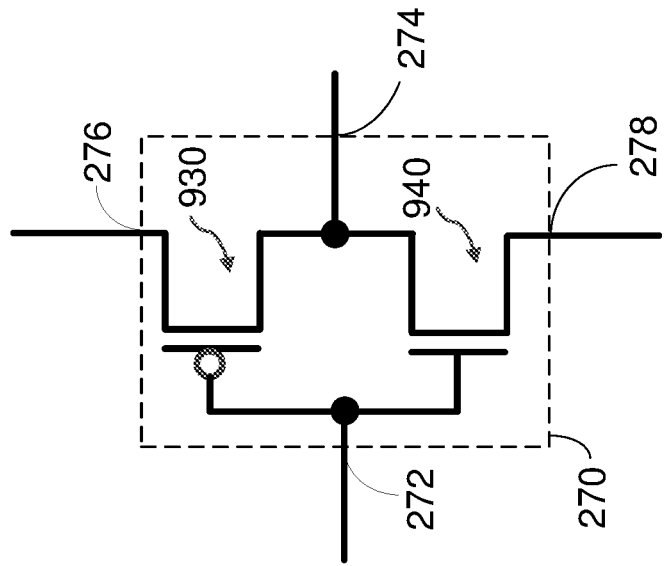
FIG. 9B shows an exemplary implementation of a second inverting circuit in the regeneration circuit according to certain aspects of the present disclosure.
Figure 9A:
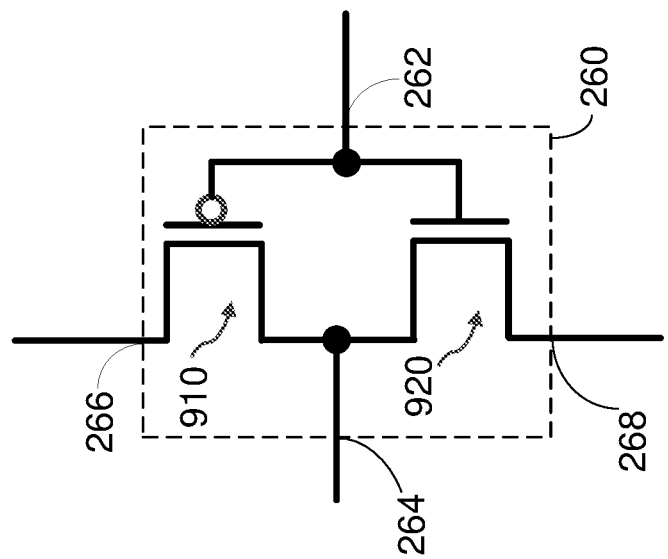
FIG. 9A shows an exemplary implementation of a first inverting circuit in the regeneration circuit according to certain aspects of the present disclosure.

FIG. 9A shows an exemplary implementation of first inverting circuit 260 according to certain aspects. In this example, the first inverting circuit 260 is a complementary inverting circuit including an PFET 910 and an NFET 920. The source of the PFET 910 is coupled to the first supply terminal 266, the drain of the PFET 910 is coupled to the output 264, and the gate of the PFET 910 is coupled to the input 262. The drain of the NFET 920 is coupled to the output 264, the gate of the NFET 920 is coupled to the input 262, and the source of the NFET 920 is coupled to the second supply terminal 268. It is to be appreciated that the first inverting circuit 260 is not limited to the example shown in FIG. 9A.

FIG. 9B shows an exemplary implementation of second inverting circuit 270 according to certain aspects. In this example, the second inverting circuit 270 is a complementary inverting circuit including an PFET 930 and an NFET 940. The source of the PFET 930 is coupled to the first supply terminal 276, the drain of the PFET 930 is coupled to the output 274, and the gate of the PFET 930 is coupled to the input 272. The drain of the NFET 940 is coupled to the output 274, the gate of the NFET 940 is coupled to the input 272, and the source of the NFET 940 is coupled to the second supply terminal 278. It is to be appreciated that the second inverting circuit 270 is not limited to the example shown in FIG. 9B.

Figure 10:
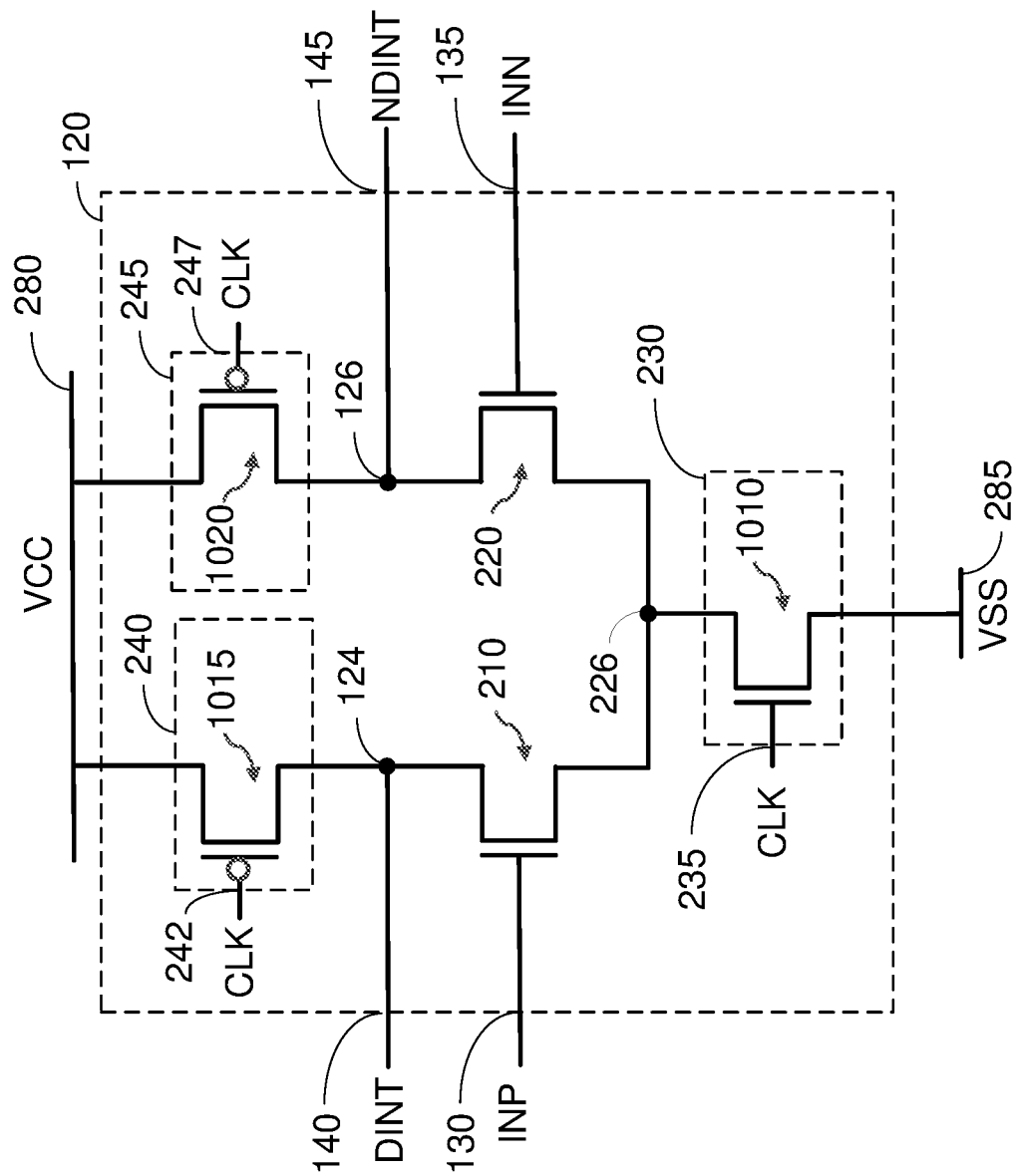
FIG. 10 shows an exemplary implementation of switches in the input circuit according to certain aspects of the present disclosure.

FIG. 10 shows an exemplary implementation of the first switch 230, the second switch 240, and the third switch 245 in the input circuit 120 according to certain aspects. In this example, the first switch 230 is implemented with an NFET 1010 in which the drain of the NFET 1010 is coupled to the sources of the input transistors 210 and 220, the gate of the NFET 1010 is coupled to the control input 235, and the source of the NFET 1010 is coupled to the lower rail 285 (e.g., ground). The second switch 240 is implemented with a first PFET 1015 in which the source of the first PFET 1015 is coupled to the upper rail 280, the gate of the first PFET 1015 is coupled to the control input 242, and the drain of the first PFET 1015 is coupled to the drain of the first input transistor 210. The third switch 245 is implemented with a second PFET 1020 in which the source of the second PFET 1020 is coupled to the upper rail 280, the gate of the second PFET 1020 is coupled to the control input 247, and the drain of the second PFET 1020 is coupled to the drain of the second input transistor 220. In this example, the first switch 230 turns on when the timing signal is high and turns off when the timing signal is low. Also, in this example, the second switch 240 and the third switch 24 turn on when the timing signal is low and turn off when the timing signal is high. It is to be appreciated that the first switch 230, the second switch 240, and the third switch 245 are not limited to the exemplary implementation shown in FIG. 10.

Figure 11:
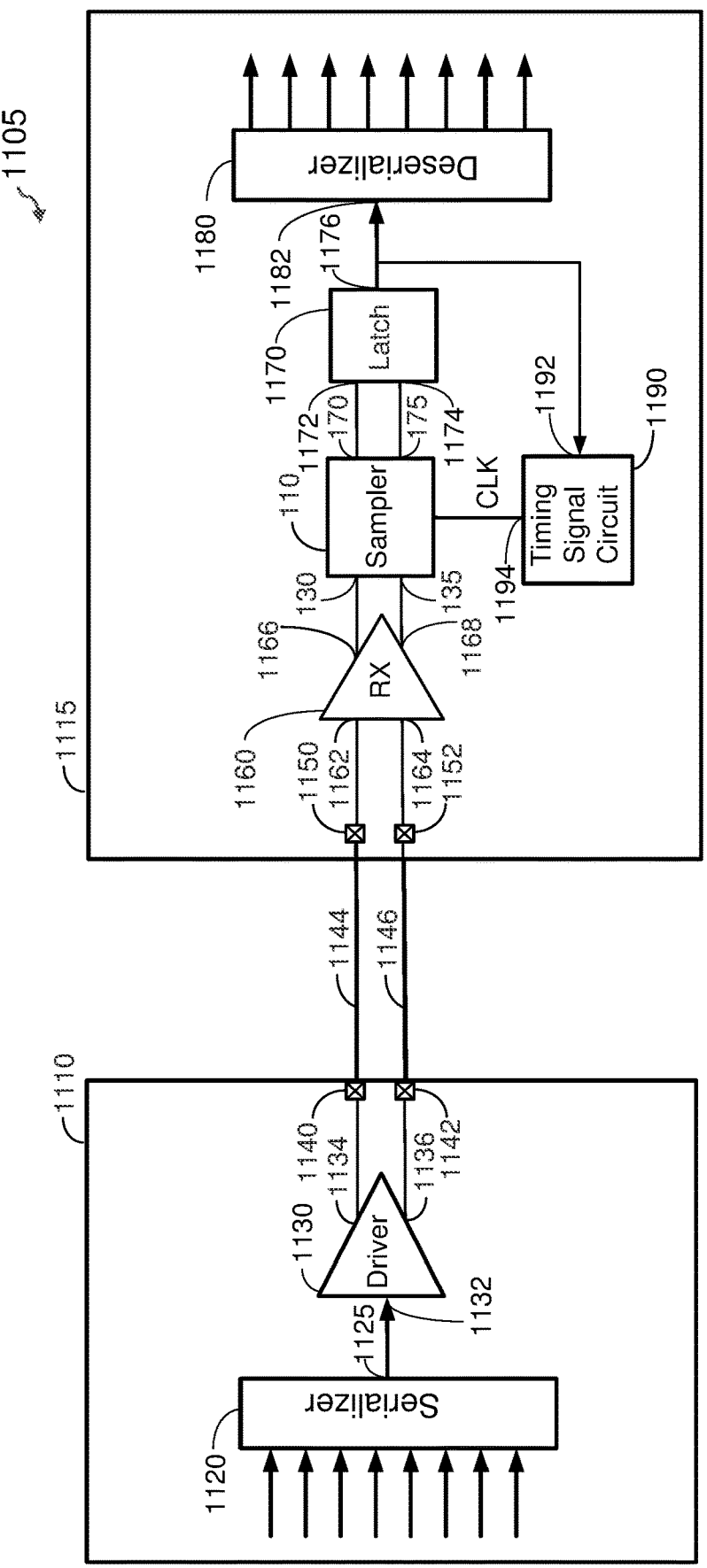
FIG. 11 shows an example of a system in which aspects of the present disclosure may be used according to certain aspects of the present disclosure.

FIG. 11 shows an example of a system 1105 in which aspects of the present disclosure may be used. In this example, the system 1105 includes a first chip 1110 and a second chip 1115 in which SerDes may be used for communication between the first chip 1110 and the second chip 1115. The first chip 1110 includes a serializer 1120, a driver 1130, a first output pin 1140, and a second output pin 1142. The second chip 1115 includes a first receive pin 1150, a second receive pin 1152, a receiver 1160, the sampler 110, a latch 1170, and a deserializer 1180.

In this example, the first chip 1110 and the second chip 1115 are coupled via a differential serial link including a first line 1144 and a second line 1146. The first line 1144 is coupled between the first output pin 1140 and the first receive pin 1150, and the second line 1146 is coupled between the second output pin 1142 and the second receive pin 1152. The first line 1144 and the second line 1146 may each be implemented with a metal line on a substrate (e.g., a printed circuit board), a wire, etc.

On the first chip 1110, the serializer 1120 is configured to receive parallel data streams (e.g., from a processor on the first chip 1110) and convert the parallel data streams into a serial data stream, which is output at an output 1125 of the serializer 1120. The driver 1130 has an input 1132 coupled to the output 1125 of the serializer 1120, a first output 1134 coupled to the first output pin 1140, and a second output 1136 coupled to the second output pin 1142. The driver 1130 is configured to receive the serial data stream, convert the serial data stream into a differential signal, and drive the first line 1144 and the second line 1146 of the differential seral link with the differential data signal to transmit the differential signal to the second chip 1115. It is to be appreciated that the first chip 1110 may include additional components not shown in FIG. 11 (e.g., impedance matching network coupled to the output pins 1140 and 1142, a pre-driver coupled between the serializer 1120 and the driver 1130, etc.).

On the second chip 1115, the receiver 1160 has a first input 1162 coupled to the first receive pin 1150, a second input 1164 coupled to the second receive pin 1152, a first output 1166 coupled to the first input 130 of the sampler 110, and a second output 1168 coupled to the second input 135 of the sampler 110. The receiver 1160 may include at least one of an amplifier and an equalizer (e.g., to compensate for frequency-dependent signal attenuation between the first chip 1110 and the second chip 1115). The sampler 110 receives the differential signal from the receiver 1160 and makes bit decisions based on the differential signal, as discussed above.

In the example in FIG. 11, the first output 170 of the sampler 110 is coupled to a first input 1172 of the latch 1170, and the second output 175 of the sampler 110 is coupled to a second input 1174 of the latch 1170. The latch 1170 has an output 1176 coupled to an input 1182 of the deserializer 1180. The latch 1170 is configured to latch bit decisions from the sampler 110 and output the corresponding bits to the deserializer 1180. The deserializer 1180 is configured to convert the bits into parallel data streams, which may be output to one or more components (not shown) on the second chip 1115 for further processing. It is to be appreciated that the second chip 1115 may include additional components not shown in FIG. 11 (e.g., impedance matching network coupled to the receive pins 1150 and 1152, a clock recovery circuit, etc.).

In the example in FIG. 11, the second chip 1115 also includes a timing signal circuit 1190 configured to generate the timing signal (e.g., clock signal CLK) for the sampler 110 and output the timing signal at output 1194. The output 1194 may be coupled to the control inputs of the switches 230, 240, and 245 in the input circuit 120 and the control inputs of the switches 290 and 295 in the regeneration circuit 150 of the sampler 110.

In certain aspects, the timing signal circuit 1190 may recover the timing signal (e.g., clock signal CLK) based on the bit decisions of the sampler 110 using clock data recovery. The input 1192 of the timing signal circuit 1190 may be coupled to the output of the latch 1170 (shown in the example in FIG. 11) or may be coupled to one or both outputs 170 and 175 of the sampler 110 to receive the bit decisions.

In certain aspects, the timing signal circuit 1190 may include a clock generator which may include a phase locked loop (PLL), a delay locked loop (DLL), an oscillator, or any combination thereof to generate the timing signal (e.g., clock signal CLK). It is to be appreciated that the timing signal circuit 1190 may be implemented using various types of clock generators.

Figure 12:
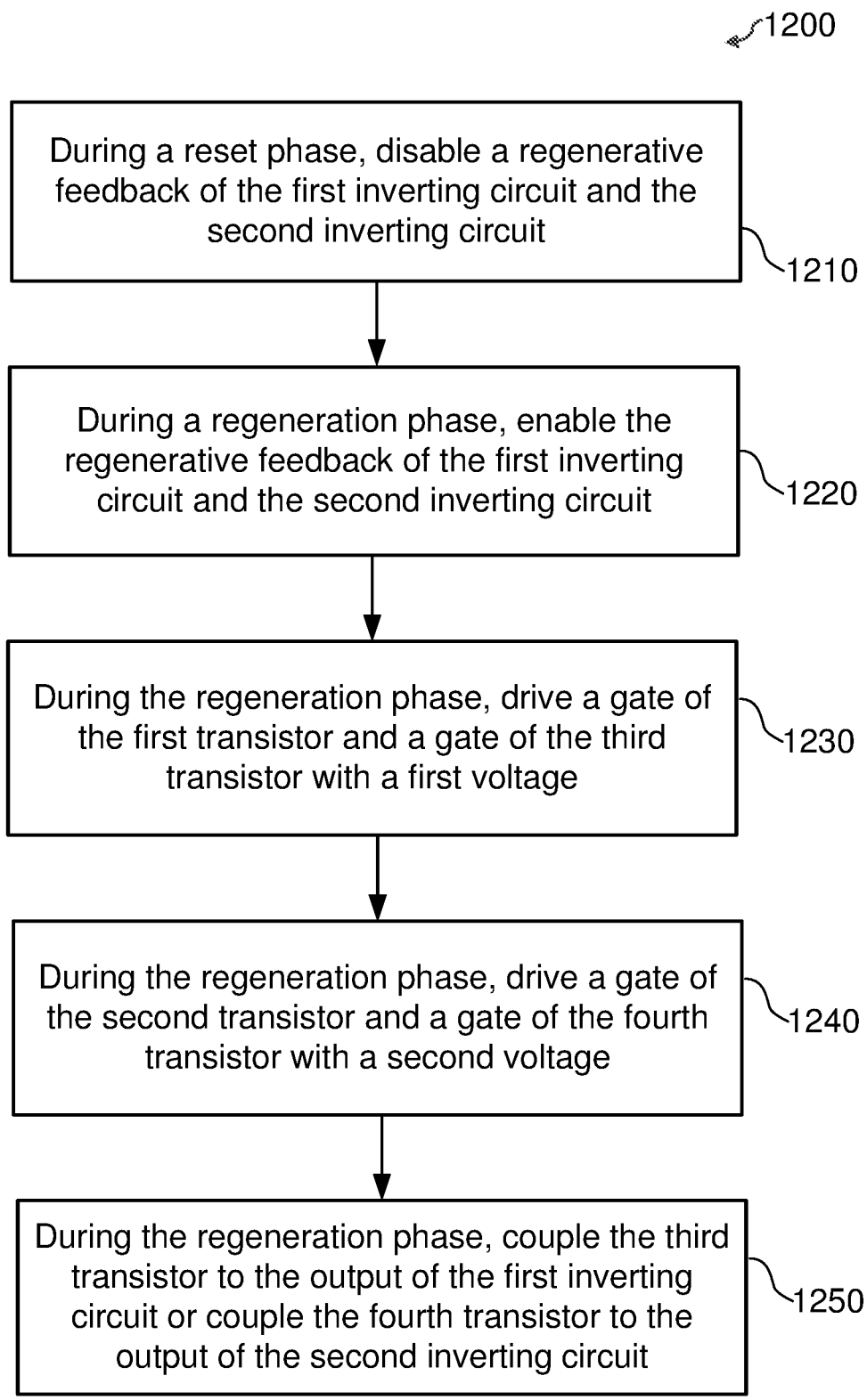
FIG. 12 is a flowchart illustrating an exemplary method of operating a regeneration circuit according to certain aspects of the present disclosure.

FIG. 12 illustrates a method 1200 of operating a regeneration circuit of a sampler according to certain aspects. The regeneration circuit (e.g., regeneration circuit 150) includes a first inverting circuit (e.g., first inverting circuit 260) having an input and an output, a second inverting circuit (e.g., second inverting circuit 270) having an input and an output, a first transistor (e.g., first input transistor 250) coupled to the input of the second inverting circuit, a second transistor (e.g., second input transistor 255) coupled to the input of the first inverting circuit, a third transistor (e.g., third input transistor 610), and a fourth transistor (e.g., fourth input transistor 620).

At block 1210, during a reset phase, a regenerative feedback of the first inverting circuit and the second inverting circuit is disabled. For example, disabling the regenerative feedback of the first inverting circuit and the second inverting circuit may include decoupling the output of the first inverting circuit from the first transistor, and decoupling the output of the second inverting circuit from the second transistor. For example, the output of the first inverting circuit may be decoupled from the first transistor by turning off the first switch 290 (e.g., using the timing signal), and the output of the second inverting circuit may be decoupled from the second transistor by turning off the second switch 295 (e.g., using the timing signal). In another example, disabling the regenerative feedback of the first inverting circuit and the second inverting circuit may include turning off the switch 296 shown in FIG. 2C.

At block 1220, during a regeneration phase, the regenerative feedback of the first inverting circuit and the second inverting circuit is enabled. For example, enabling the regenerative feedback of the first inverting circuit and the second inverting circuit may include coupling the output of the first inverting circuit to the first transistor, and coupling the output of the second inverting circuit to the second transistor. For example, the output of the first inverting circuit may be coupled to the first transistor by turning on the first switch 290 (e.g., using the timing signal), and the output of the second inverting circuit may be coupled to the second transistor by turning on the second switch 295 (e.g., using the timing signal). In another example, enabling the regenerative feedback of the first inverting circuit and the second inverting circuit may include turning on the switch 296 shown in FIG. 2C.

At block 1230, during the regeneration phase, a gate of the first transistor and a gate of the third transistor are driven with a first voltage. For example, the input circuit 120 may drive the gate of the first transistor and the gate of the third transistor with the first voltage DINT.

At block 1240, during the regeneration phase, a gate of the second transistor and a gate of the fourth transistor are driven with a second voltage. For example, the input circuit 120 may drive the gate of the second transistor and the gate of the fourth transistor with the second voltage NDINT.

At block 1250, during the regeneration phase, the third transistor is coupled to the output of the first inverting circuit or the fourth transistor is coupled to the output of the second inverting circuit. For example, the third switch 630 may couple the third transistor to the output of the first inverting circuit or the fourth switch 640 may couple the fourth transistor to the output of the second inverting circuit.

In certain aspects, during the regeneration phase, the first voltage falls at a first rate, the second voltage falls at a second rate, and the first rate is different from the second rate. For example, the first rate may be based on a first input signal (e.g., INP) to the sampler, and the second rate may be based on a second input signal (e.g., INN) to the sampler. In one example, the first input transistor 210 of the input circuit 120 may discharge the first node 222 based on the first input signal INP causing the first voltage DINT to fall at the first rate, and the second input transistor 220 of the input circuit 120 may discharge the second node 224 based on the second input signal INN causing the second voltage NDINT to fall at the second rate. In this example, the gate of the first input transistor 210 may be driven by the first input signal INP, and the gate of the second input transistor 220 may be driven by the second input signal INN.

In certain aspects, the first rate is greater than the second rate if the first input signal is greater than the second input signal (e.g., INP>INN), and the second rate is greater than the first rate if the second input signal is greater than the first input signal (e.g., INN>INP).

In certain aspects, coupling the third transistor to the output of the first inverting circuit or coupling the fourth transistor to the output of the second inverting circuit includes coupling the third transistor to the output of the first inverting circuit based on a voltage at the input of the first inverting circuit or coupling the fourth transistor to the output of the second inverting circuit based on a voltage at the input of the second inverting circuit. For example, the control input 635 of the third switch 630 may be coupled to the input 262 of the first inverting circuit 260, and the control input 645 of the fourth switch 640 may be coupled to the input 272 of the second inverting circuit 270.

The method 1200 may also include, during the reset phase, pulling up the first voltage and the second voltage to a supply voltage. For example, the first voltage DINT and the second voltage NDINT may be pulled up to the supply voltage VCC by turning on the second switch 240 and the third switch 245 of the input circuit 120 in the reset phase.

Implementation examples are described in the following numbered clauses:

1. A regeneration circuit, comprising:
   a first inverting circuit having an input and an output;
   a second inverting circuit having an input and an output;
   a first transistor coupled to the input of the second inverting circuit, wherein a gate of the first transistor is coupled to a first input;
   a second transistor coupled to the input of the first inverting circuit, wherein a gate of the second transistor is coupled to a second input;
   a third transistor, wherein a gate of the third transistor is coupled to the first input;
   a fourth transistor, wherein a gate of the fourth transistor is coupled to the second input;
   a first switch, wherein the first switch and the third transistor are coupled in series between a first rail and the first transistor; and
   a second switch, wherein the second switch and the fourth transistor are coupled in series between the first rail and the second transistor.

2. The regeneration circuit of clause 1, wherein:
   the first switch is coupled between a drain of the third transistor and a drain of the first transistor; and
   the second switch is coupled between a drain of the fourth transistor and a drain of the second transistor.

3. The regeneration circuit of clause 2, wherein:
   a source of the third transistor is coupled to the first rail;
   a source of the fourth transistor is coupled to the first rail;
   a source of the first transistor is coupled to a second rail; and
   a source of the second transistor is coupled to the second rail.

4. The regeneration circuit of clause 3, wherein the second rail is coupled to a ground.

5. The regeneration circuit of any one of clauses 1 to 4, wherein:
   the first transistor comprises a first n-type field effect transistor (NFET);
   the second transistor comprises a second NFET;
   the third transistor comprises a first p-type field effect transistor (PFET); and
   the fourth transistor comprises a second PFET.

6. The regeneration circuit any one of clauses 1 to 5, wherein:
   the first switch has a control input coupled to the input of the first inverting circuit; and
   the second switch has a control input coupled to the input of the second inverting circuit.

7. The regeneration circuit of clause 6, wherein:
   the first switch comprises a first p-type field effect transistor (PFET) having a gate coupled to the input of the first inverting circuit; and
   the second switch comprises a second PFET having a gate coupled to the input of the second inverting circuit.

8. The regeneration circuit of any one of clauses 1 to 7, further comprising:
   a third switch coupled between the first transistor and the output of the first inverting circuit; and
   a fourth switch coupled between the second transistor and the output of the second inverting circuit.

9. The regeneration circuit of clause 8, wherein:
   the third switch has a control input configured to receive a timing signal; and
   the fourth switch has a control input configured to receive the timing signal.

10. The regeneration circuit of clause 9, wherein the timing signal comprises a clock signal.

11. A regeneration circuit, comprising:
a first inverting circuit having an input and an output;
a second inverting circuit having an input and an output;
a first transistor coupled to the input of the second inverting circuit, wherein a gate of the first transistor is coupled to a first input;
a second transistor coupled to the input of the first inverting circuit, wherein a gate of the second transistor is coupled to a second input;
a pull-up circuit coupled to the input of the first inverting circuit and the input of the second inverting circuit; and
a pull-down circuit coupled to the input of the first inverting circuit and the input of the second inverting circuit.

12. The regeneration circuit of clause 11, wherein the pull-up circuit comprises:
a third transistor coupled between the input of the first inverting circuit and a rail, wherein a gate of the third transistor is coupled to the output of the first inverting circuit; and
a fourth transistor coupled between the input of the second inverting circuit and the rail, wherein a gate of the fourth transistor is coupled to the output of the second inverting circuit.

13. The regeneration circuit of clause 12, wherein:
the third transistor comprises a first p-type field effect transistor (PFET); and
the fourth transistor comprises a second PFET.

14. The regeneration circuit of clause 13, wherein:
a source of the first PFET is coupled to the rail and a drain of the first PFET is coupled to the input of the first inverting circuit; and
a source of the second PFET is coupled to the rail and a drain of the second PFET is coupled to the input of the second inverting circuit.

15. The regeneration circuit of clause 11, wherein the pull-down circuit comprises:
a third transistor coupled between the input of the first inverting circuit and a rail, wherein a gate of the third transistor is coupled to the input of the second inverting circuit or the output of the first inverting circuit; and
a fourth transistor coupled between the input of the second inverting circuit and the rail, wherein a gate of the fourth transistor is coupled to the input of the first inverting circuit or the output of the second inverting circuit.

16. The regeneration circuit of clause 15, wherein:
the third transistor comprises a first n-type field effect transistor (NFET); and
the fourth transistor comprises a second NFET.

17. The regeneration circuit of clause 16, wherein:
a drain of the first NFET is coupled to the input of the first inverting circuit and a source of the first NFET is coupled to the rail; and
a drain of the second NFET is coupled to the input of the second inverting circuit and a source of the second NFET is coupled to the rail.

18. The regeneration circuit of any one of clauses 15 to 17, wherein the rail is coupled to ground.

19. The regeneration circuit of any one of clauses 11 to 18, further comprising:
a first switch coupled between the first transistor and the output of the first inverting circuit; and
a second switch coupled between the second transistor and the output of the second inverting circuit.

20. The regeneration circuit of clause 19, wherein:
the first switch has a control input configured to receive a timing signal; and
the second switch has a control input configured to receive the timing signal.

21. A method of operating a regeneration circuit of a sampler, wherein the regeneration circuit includes a first inverting circuit having an input and an output, a second inverting circuit having an input and an output, a first transistor coupled to the input of the second inverting circuit, a second transistor coupled to the input of the first inverting circuit, a third transistor, and a fourth transistor, the method comprising:
during a reset phase,
disabling a regenerative feedback of the first inverting circuit and the second inverting circuit;
during a regeneration phase,
enabling the regenerative feedback of the first inverting circuit and the second inverting circuit;
driving a gate of the first transistor and a gate of the third transistor with a first voltage;
driving a gate of the second transistor and a gate of the fourth transistor with a second voltage; and
coupling the third transistor to the output of the first inverting circuit or coupling the fourth transistor to the output of the second inverting circuit.

22. The method of clause 21, during the regeneration phase, the first voltage falls at a first rate, the second voltage falls at a second rate, and the first rate is different from the second rate.

23. The method of clause 22, wherein the first rate is based on a first input signal to the sampler, and the second rate is based on a second input signal to the sampler.

24. The method of clause 23, wherein the first rate is greater than the second rate if the first input signal is greater than the second input signal, and the second rate is greater than the first rate if the second input signal is greater than the first input signal.

25. The method of any one of clauses 22 to 24, wherein coupling the third transistor to the output of the first inverting circuit or coupling the fourth transistor to the output of the second inverting circuit comprises:
coupling the third transistor to the output of the first inverting circuit if the first rate is greater than the second rate; and
coupling the fourth transistor to the output of the second inverting circuit if the second rate is greater than the first rate.

26. The method of any one of clauses 22 to 25, wherein coupling the third transistor to the output of the first inverting circuit or coupling the fourth transistor to the output of the second inverting circuit comprises:
coupling the third transistor to the output of the first inverting circuit based on a voltage at the input of the first inverting circuit or coupling the fourth transistor to the output of the second inverting circuit based on a voltage at the input of the second inverting circuit.

27. The method of any one of clauses 21 to 26, further comprising, during the reset phase, pulling up the first voltage and the second voltage to a supply voltage.

28. The method of any one of clauses 21 to 27, wherein:
the first transistor comprises a first n-type field effect transistor (NFET);
the second transistor comprises a second NFET;
the third transistor comprises a first p-type field effect transistor (PFET); and
the fourth transistor comprises a second PFET.

29. The method of any one of clauses 21 to 28, wherein:
disabling the regenerative feedback of the first inverting circuit and the second inverting circuit comprises:
decoupling the output of the first inverting circuit from the first transistor; and
decoupling the output of the second inverting circuit from the second transistor; and
enabling the regenerative feedback of the first inverting circuit and the second inverting circuit comprises:
coupling the output of the first inverting circuit to the first transistor; and
coupling the output of the second inverting circuit to the second transistor.

30. The regeneration circuit of any one of clauses 12 to 14, wherein the pull-down circuit comprises:
a fifth transistor coupled between the input of the first inverting circuit and a second rail, wherein a gate of the fifth transistor is coupled to the input of the second inverting circuit or the output of the first inverting circuit; and
a sixth transistor coupled between the input of the second inverting circuit and the second rail, wherein a gate of the sixth transistor is coupled to the input of the first inverting circuit or the output of the second inverting circuit.

31. The regeneration circuit of clause 30, wherein:
the fifth transistor comprises a first n-type field effect transistor (NFET); and
the sixth transistor comprises a second NFET.

32. The regeneration circuit of clause 31, wherein:
a drain of the first NFET is coupled to the input of the first inverting circuit and a source of the first NFET is coupled to the rail; and
a drain of the second NFET is coupled to the input of the second inverting circuit and a source of the second NFET is coupled to the rail.

33. The regeneration circuit of any one of clauses 30 to 32, wherein the second rail is coupled to ground.

It is to be appreciated that the present disclosure is not limited to the exemplary terminology used above to describe aspects of the present disclosure.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element. Further, it is to be appreciated that the designations "first," "second," and so forth in the written description do not necessarily match the designations "first," "second," and so forth in the claims.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A regeneration circuit, comprising:
a first inverting circuit;
a second inverting circuit;
a first transistor coupled to an input of the second inverting circuit;
a second transistor coupled to an input of the first inverting circuit;
a third transistor including a gate coupled to a gate of the first transistor;
a first switch configured to couple the third transistor to the input of the second inverting circuit based on a voltage of the first inverting circuit;
a fourth transistor including a gate coupled to a gate of the second transistor; and
a second switch configured to couple the fourth transistor to the input of the first inverting circuit based on a voltage of the second inverting circuit.

2. The regeneration circuit of claim 1, wherein:
the first switch comprises a fifth transistor; and
the second switch comprises a sixth transistor.

3. The regeneration circuit of claim 2, wherein:
a gate of the fifth transistor is coupled to the input of the first inverting circuit; and
a gate of the sixth transistor is coupled to the input of the second inverting circuit.

4. The regeneration circuit of claim 3, wherein:
the fifth transistor comprises a first p-type field effect transistor (PFET); and
the sixth transistor comprises a second PFET.

5. The regeneration circuit of claim 1, wherein:
the voltage of the first inverting circuit comprises a voltage at the input of the first inverting circuit; and
the voltage of the second inverting circuit comprises a voltage at the input of the second inverting circuit.

6. The regeneration circuit of claim 5, wherein the first switch is configured to:
couple the third transistor to the input of the second inverting circuit when the voltage of the first inverting circuit is below a threshold voltage of the first switch; and
decouple the third transistor from the input of the second inverting circuit when the voltage of the first inverting circuit is above threshold voltage of the first switch.

7. The regeneration circuit of claim 6, wherein the second switch is configured to:
couple the fourth transistor to the input of the first inverting circuit when the voltage of the second inverting circuit is below a threshold voltage of the second switch; and
decouple the fourth transistor from the input of the first inverting circuit when the voltage of the second inverting circuit is above threshold voltage of the second switch.

8. The regeneration circuit of claim 1, wherein:
the third transistor is coupled between a first rail and the first switch; and
the fourth transistor is coupled between the first rail and the second switch.

9. The regeneration circuit of claim 8, wherein:
the first transistor is coupled between the input of the second inverting circuit and a second rail; and
the second transistor is coupled between the input of the first inverting circuit and the second rail.

10. The regeneration circuit of claim 9, wherein the first rail has a higher potential than the second rail.

11. The regeneration circuit of claim 9, wherein:
the first switch comprises a fifth transistor; and
the second switch comprises a sixth transistor.

12. The regeneration circuit of claim 11, wherein:
a gate of the fifth transistor is coupled to the input of the first inverting circuit; and
a gate of the sixth transistor is coupled to the input of the second inverting circuit.

13. The regeneration circuit of claim 1, further comprising one or more switches configured to enable cross-coupling of the first inverting circuit and the second inverting circuit based on a timing signal.

14. The regeneration circuit of claim 13, wherein the timing signal comprises a clock signal.

15. The regeneration circuit of claim 14, wherein the one or more switches are configured to enable the cross-coupling of the first inverting circuit and the second inverting circuit when the clock signal is high, and disable the cross-coupling of the first inverting circuit and the second inverting circuit when the clock signal is low.

16. The regeneration circuit of claim 13, wherein the one or more switches comprise:
a fifth transistor coupled between the first transistor and an output of the first inverting circuit; and
a sixth transistor coupled between the second transistor and an output of the second inverting circuit.

17. The regeneration circuit of claim 16, wherein:
a gate of the fifth transistor is configured to receive a timing signal; and
a gate of the sixth transistor is configured to receive the timing signal.

18. The regeneration circuit of claim 17, wherein the timing signal comprises a clock signal.

19. The regeneration circuit of claim 17, wherein:
the fifth transistor comprises a first n-type field effect transistor (NFET); and
the sixth transistor comprises a second NFET.

* * * * *